United States Patent [19]
Halsey et al.

[11] Patent Number: 5,855,744
[45] Date of Patent: Jan. 5, 1999

[54] NON-PLANAR MAGNET TRACKING DURING MAGNETRON SPUTTERING

[75] Inventors: Harlan I. Halsey, Woodside; Richard E. Demaray, Portola Valley; Russell Black, San Carlos; Akihiro Hosokawa, Cupertino; Allan De Salvo, Los Gatos; Victoria L. Hall, Menlo Park, all of Calif.

[73] Assignee: Applied Komatsu Technology, Inc., Tokyo, Japan

[21] Appl. No.: 684,446

[22] Filed: Jul. 19, 1996

[51] Int. Cl.$^6$ ..................................... C23C 14/35
[52] U.S. Cl. ................ 204/192.12; 204/298.12; 204/298.18; 204/298.19; 204/298.2
[58] Field of Search .......... 204/298.16, 298.17, 204/298.19, 298.2, 298.22, 192.12, 298.12, 298.18

[56] References Cited

U.S. PATENT DOCUMENTS

| | | | |
|---|---|---|---|
| 5,262,030 | 11/1993 | Potter | 204/298.2 |
| 5,328,585 | 7/1994 | Stevenson et al. | 204/298.19 |
| 5,382,344 | 1/1995 | Hosokawa et al. | 204/298.19 |

FOREIGN PATENT DOCUMENTS

| | | | |
|---|---|---|---|
| 27 07 144 | 8/1977 | Germany | 204/298.9 |
| 2-290971 | 11/1990 | Japan | 204/298.2 |
| 3-243762 | 10/1991 | Japan | 204/298.2 |
| 5-202471 | 8/1993 | Japan | 204/298.1 |

*Primary Examiner*—Nam Nguyen
*Assistant Examiner*—Rodney G. McDonald
*Attorney, Agent, or Firm*—Janis Biksa; Lawrence Edelman

[57] ABSTRACT

The structure and method which improves the film thickness uniformity or thickness control when using magnetron sputtering by adjusting the distance between the magnetron or a portion of the magnetron and the sputtering target to provide an improvement in the film thickness uniformity. Shimmed rails, contoured rails, contoured surfaces, cam plates, and cam plate control followers are utilized to achieve an improvement in film thickness uniformity or thickness control due to anomalies in magnetic field as a magnetron assembly moves back and forth when sputtering substrates (utilized primarily for rectangularly shaped substrates).

42 Claims, 21 Drawing Sheets

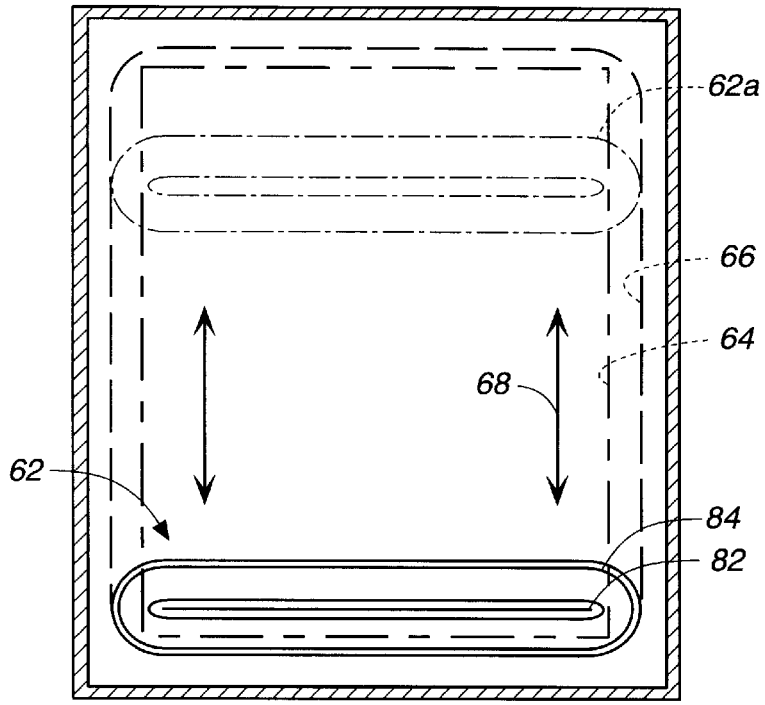
FIG._1
(PRIOR ART)
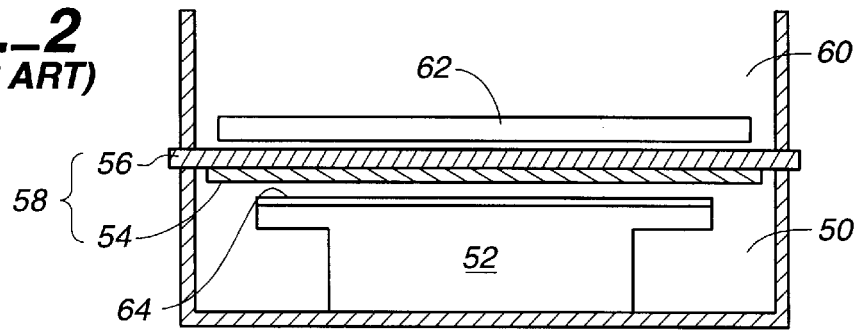
FIG._2
(PRIOR ART)
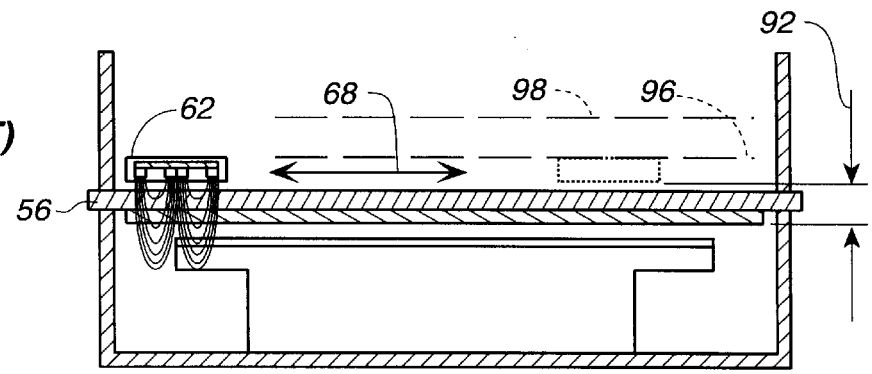
FIG._3
(PRIOR ART)

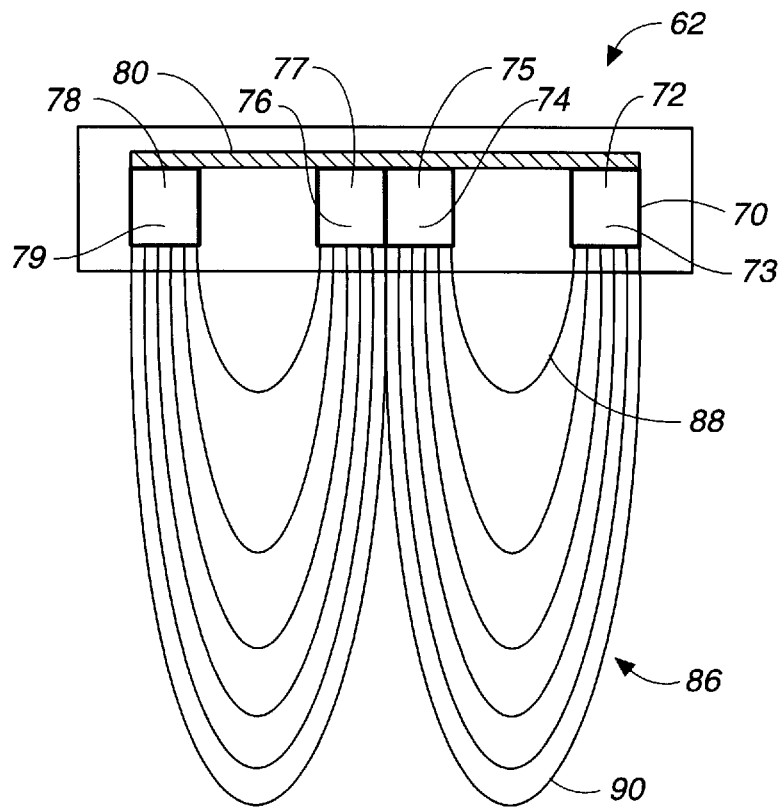
FIG._4
(PRIOR ART)
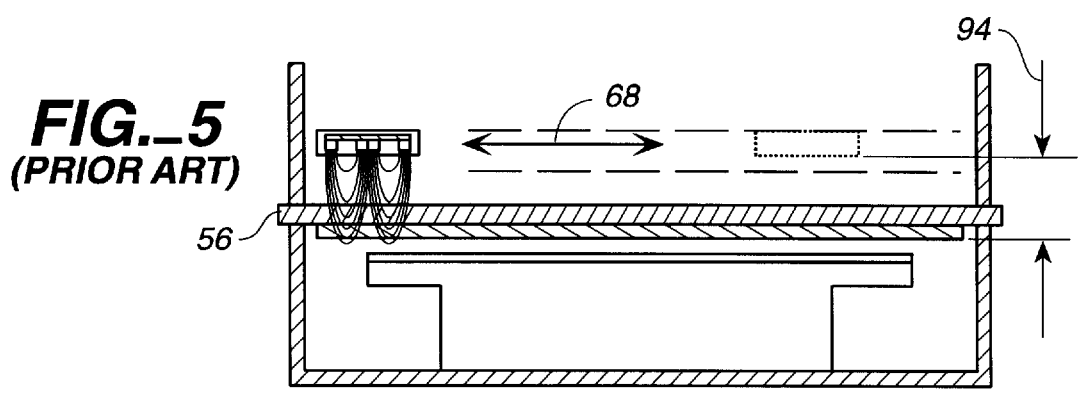
FIG._5
(PRIOR ART)

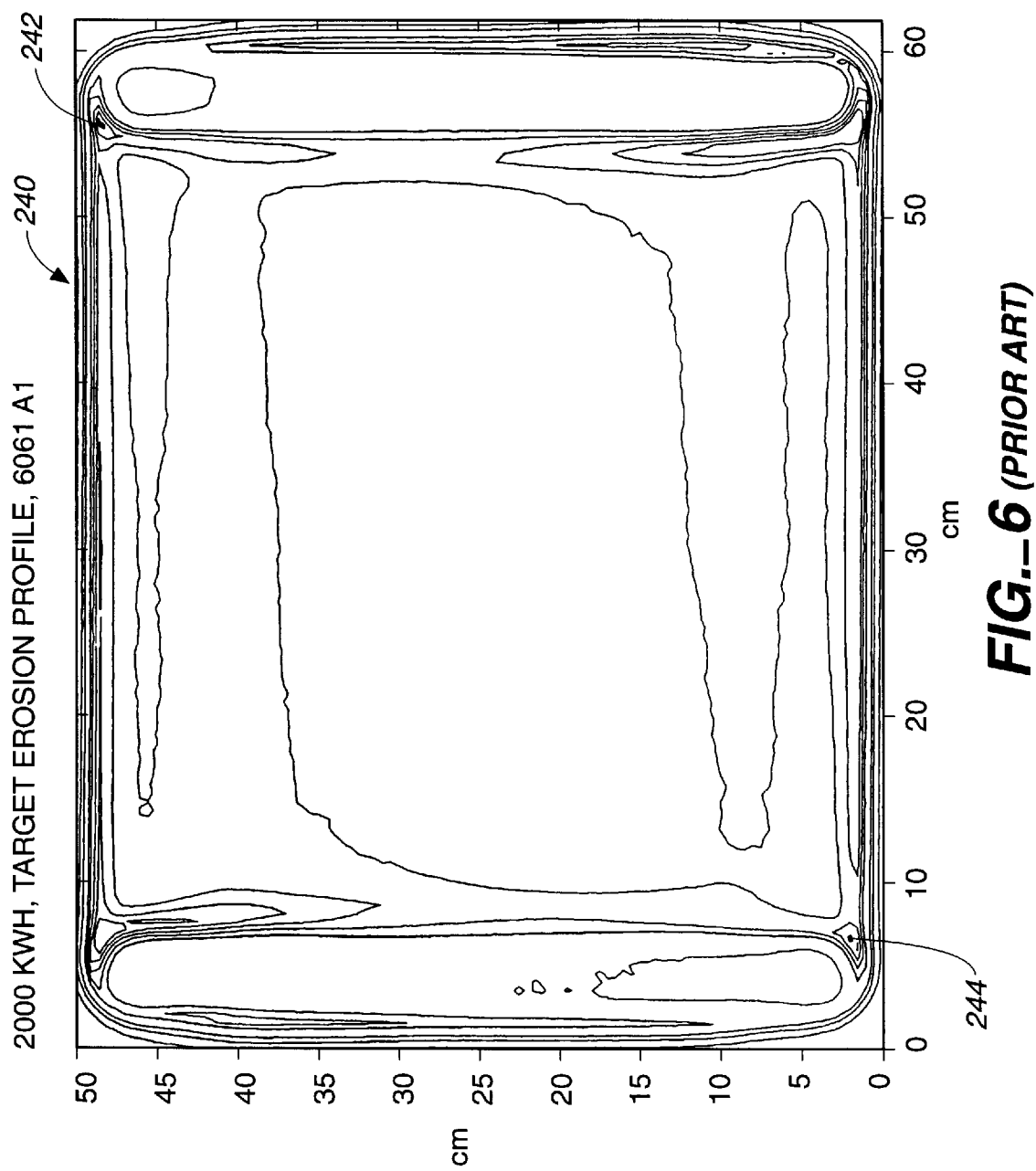
FIG._6 (PRIOR ART)

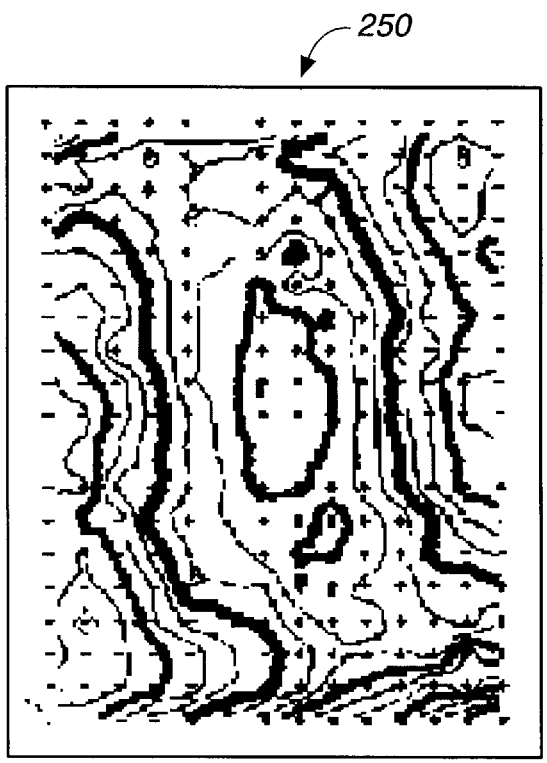
FIG._7
*(PRIOR ART)*
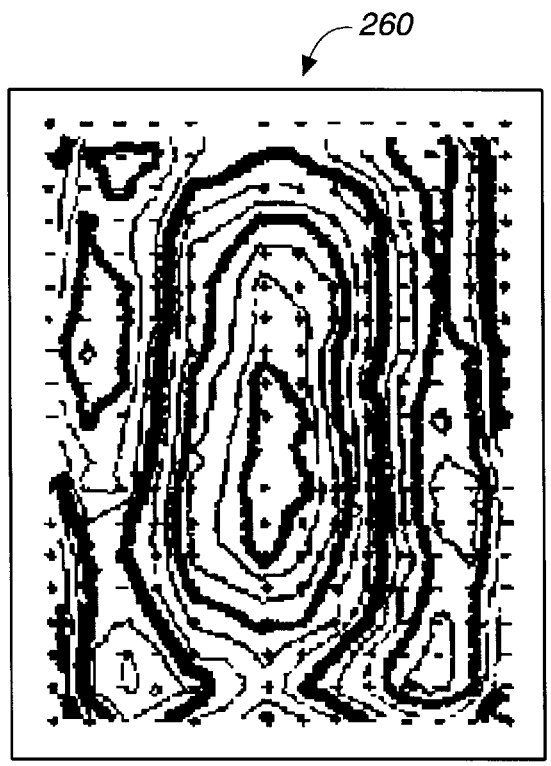
FIG._8

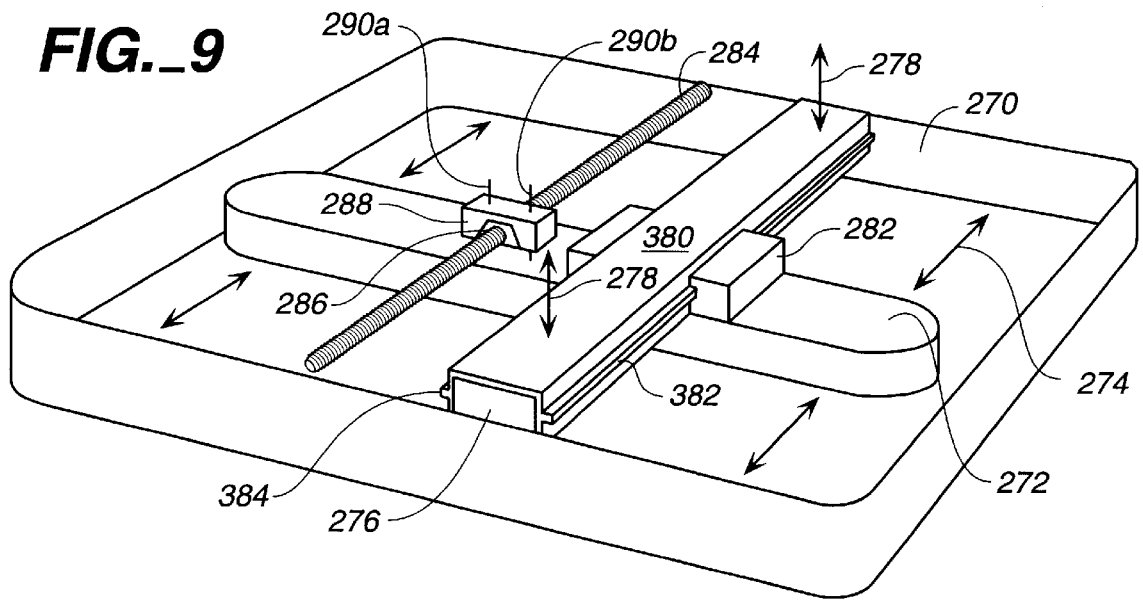
FIG._9
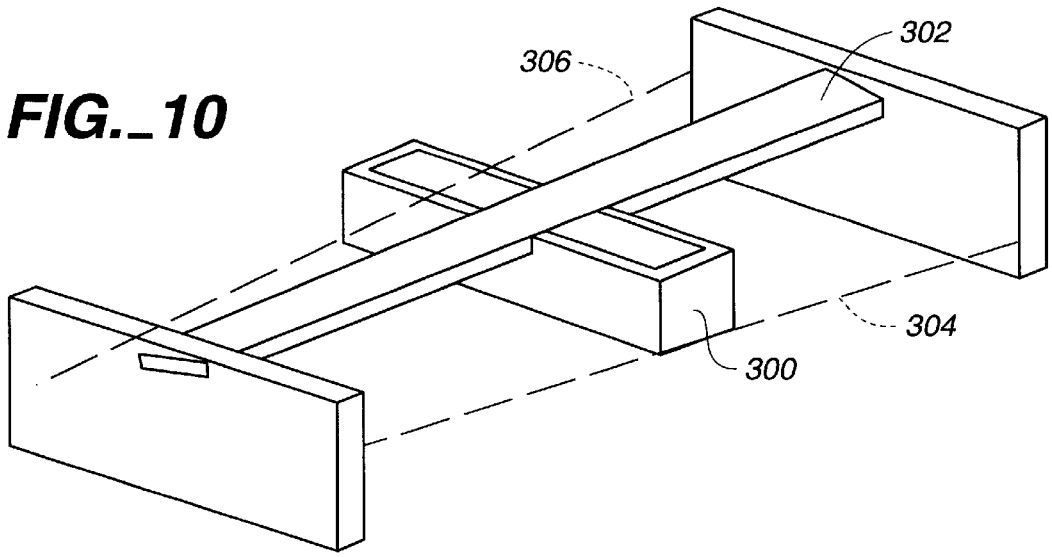
FIG._10

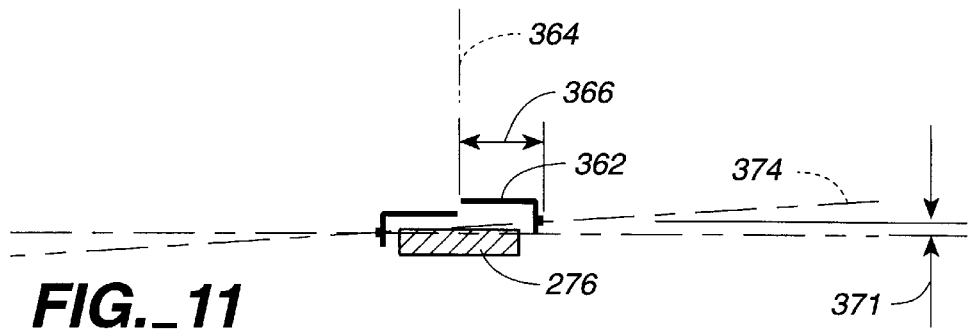
FIG._11
FIG._12
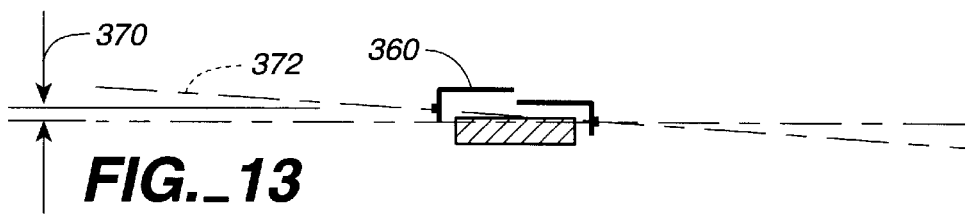
FIG._13
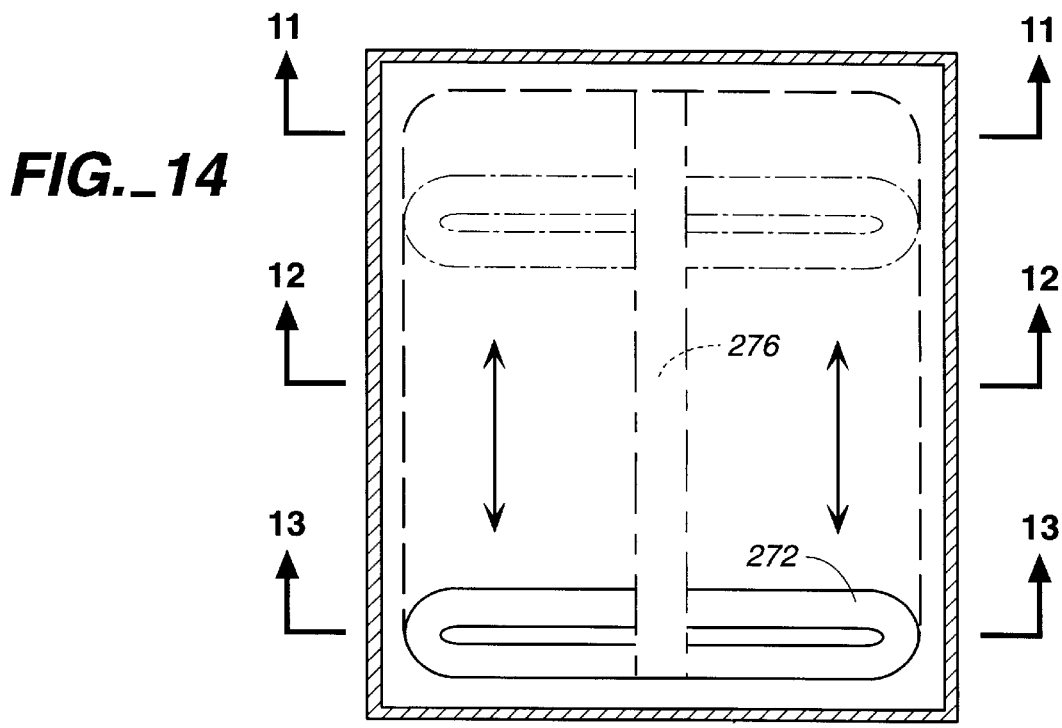
FIG._14

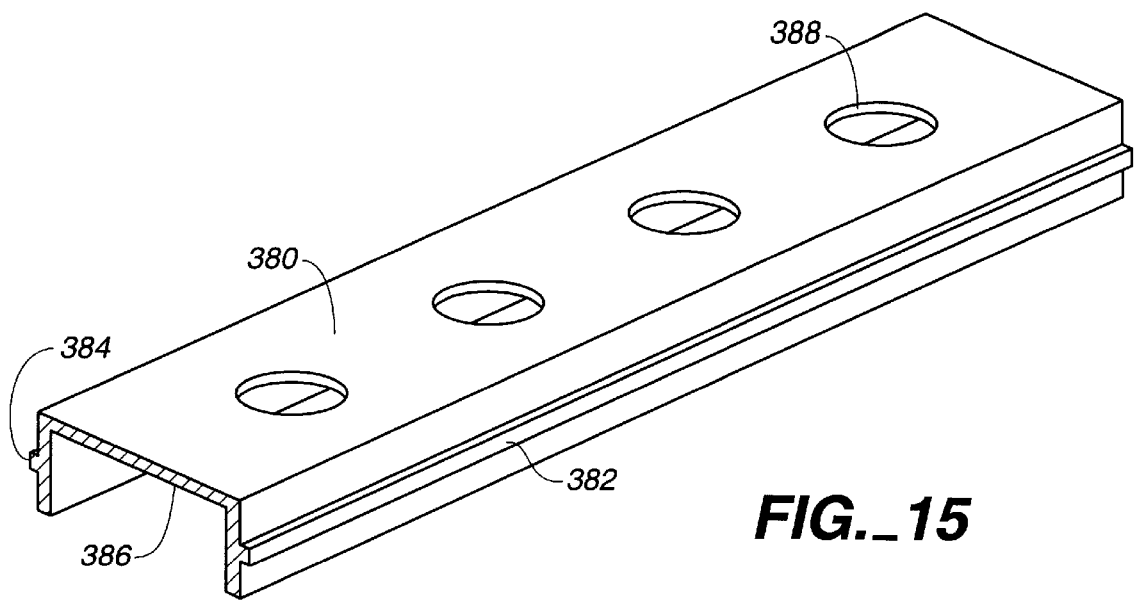
FIG._15
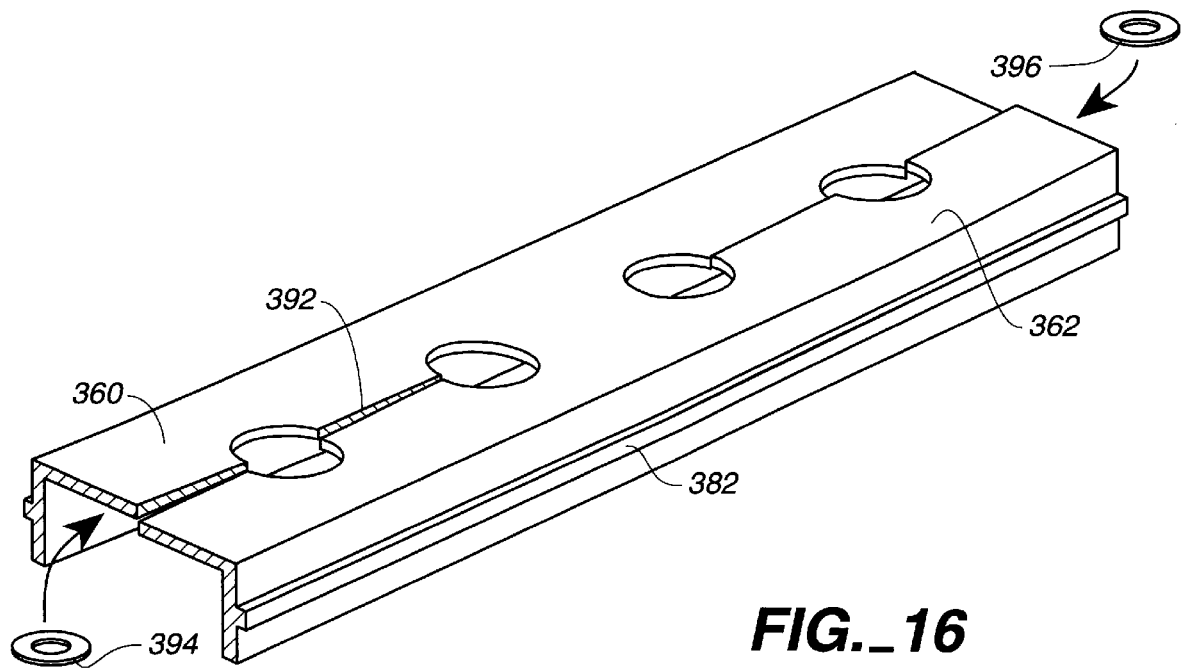
FIG._16

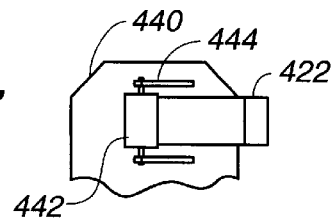
FIG._17
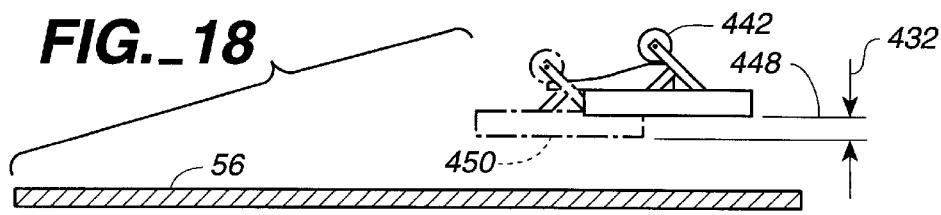
FIG._18
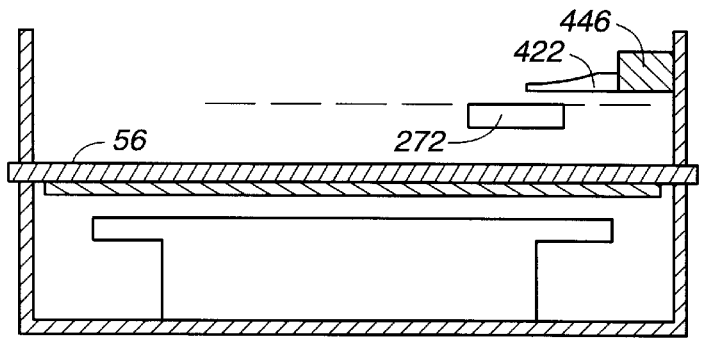
FIG._19
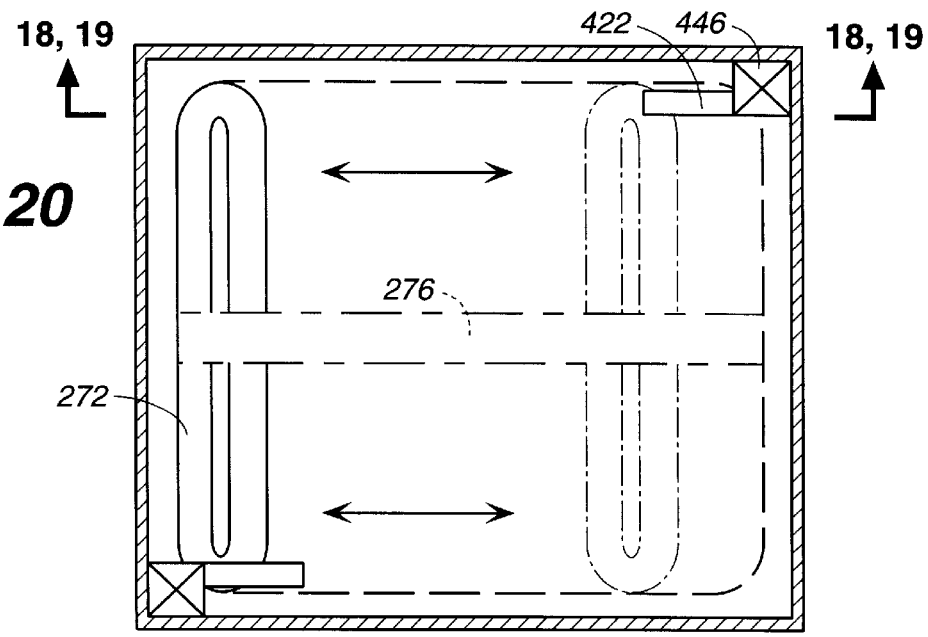
FIG._20

FIG._17A
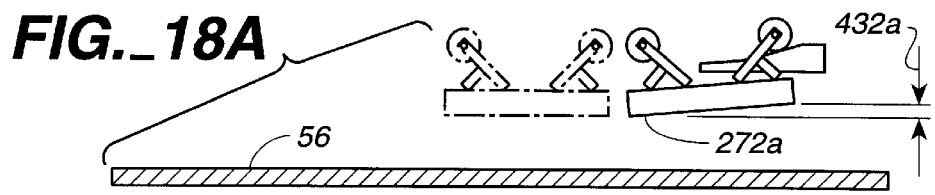
FIG._18A
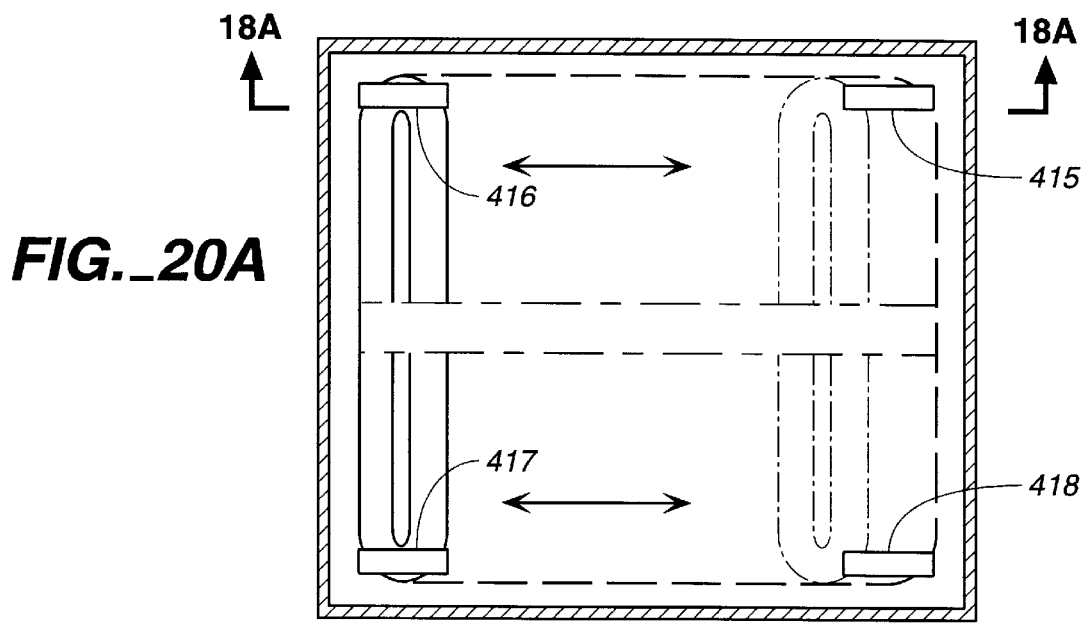
FIG._20A
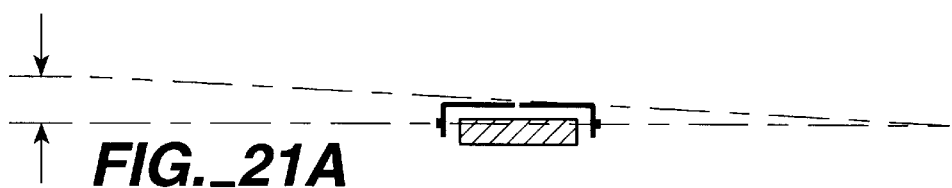
FIG._21A
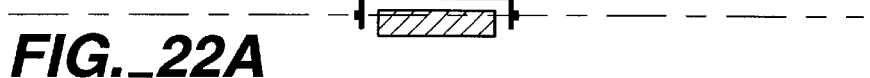
FIG._22A
FIG._23A

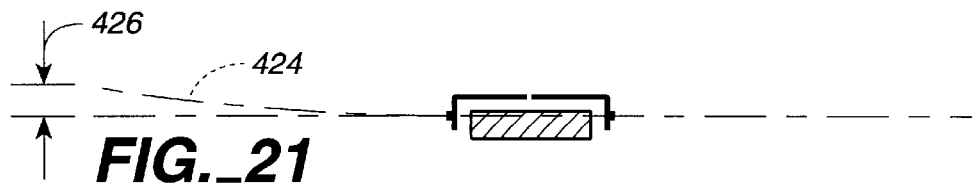
FIG._21
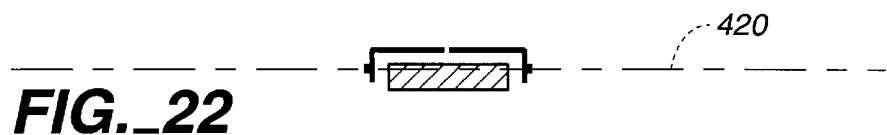
FIG._22
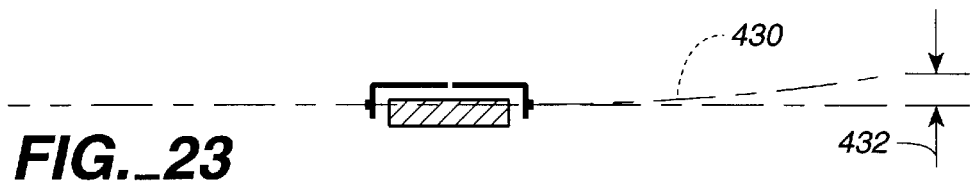
FIG._23
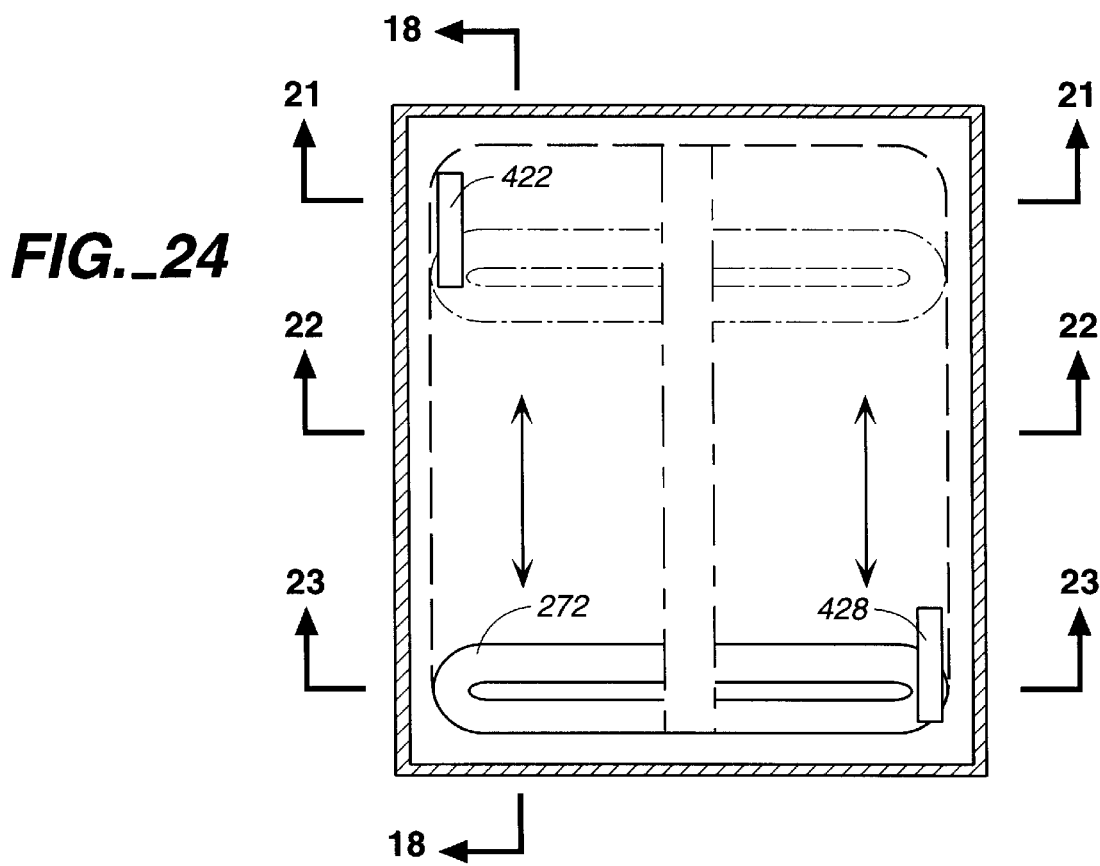
FIG._24

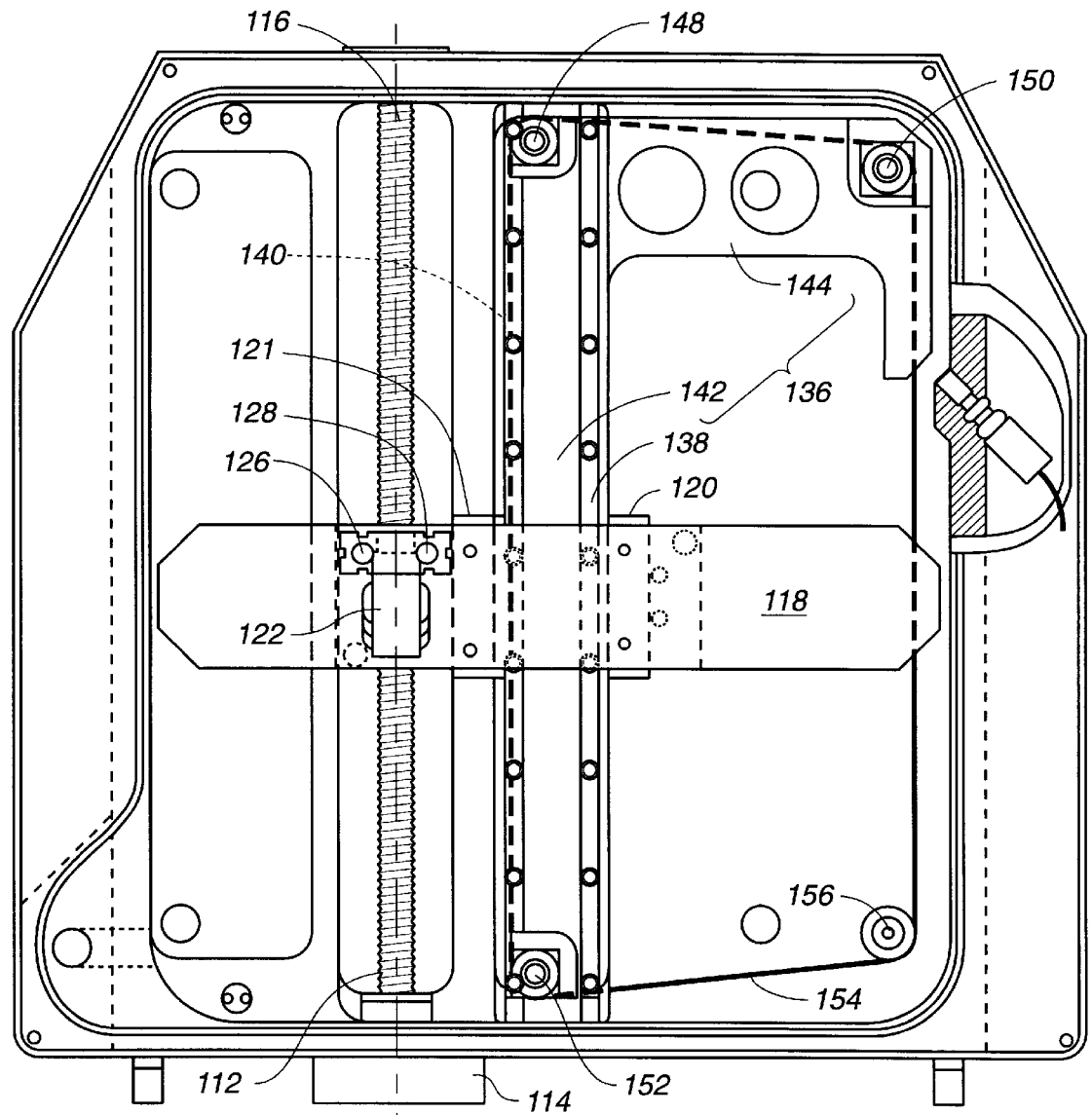
FIG._25
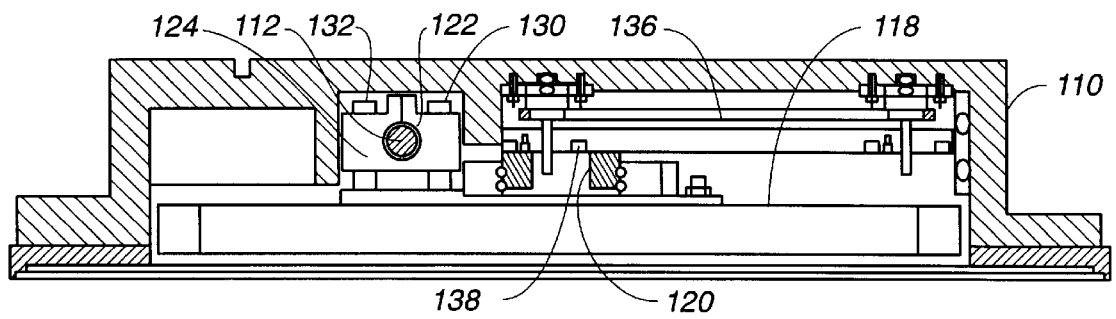
FIG._26

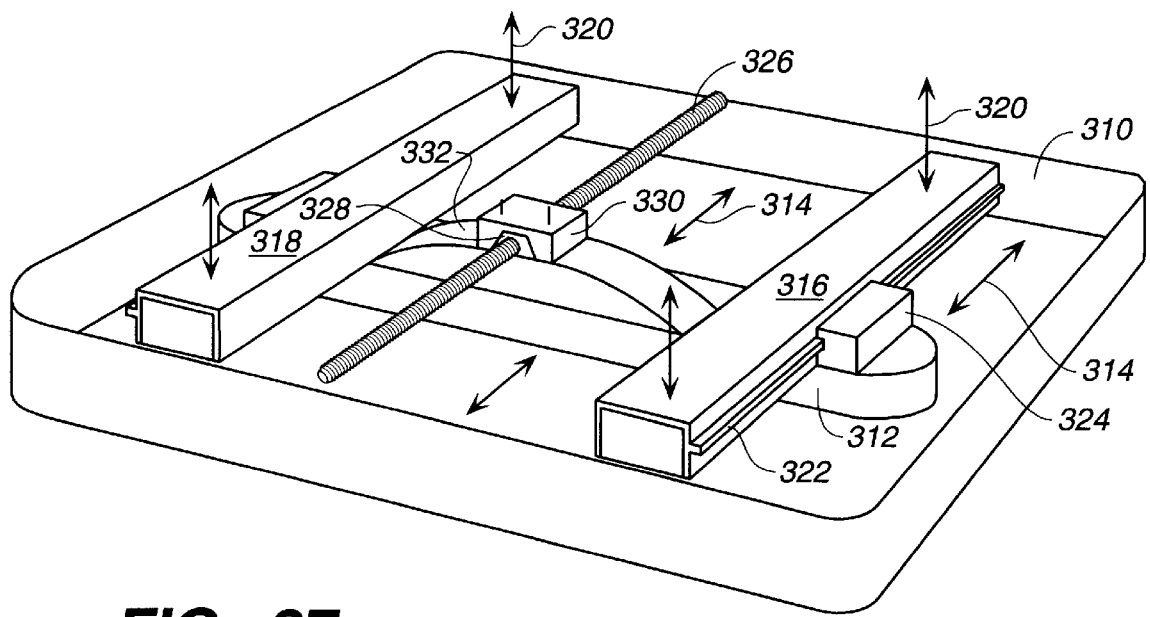
FIG._27
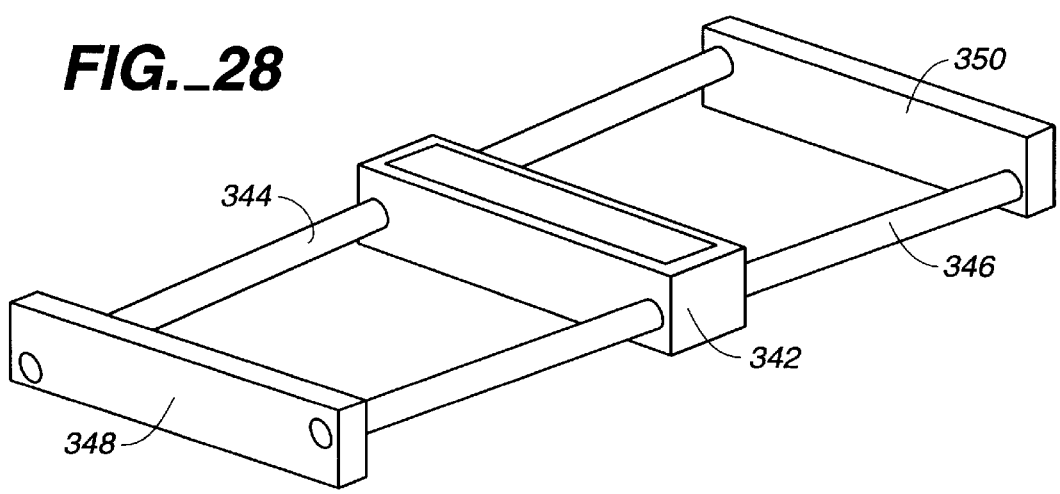
FIG._28

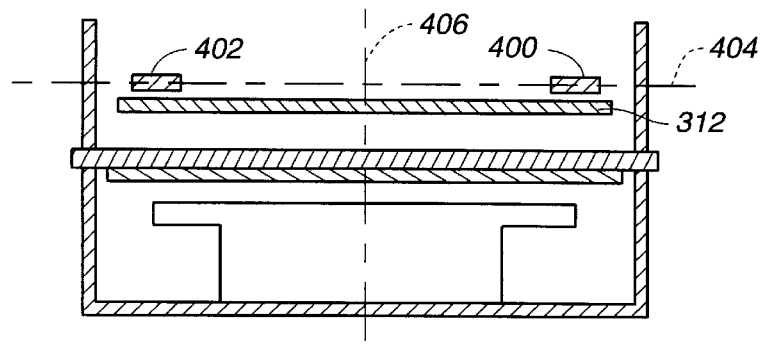
FIG._29
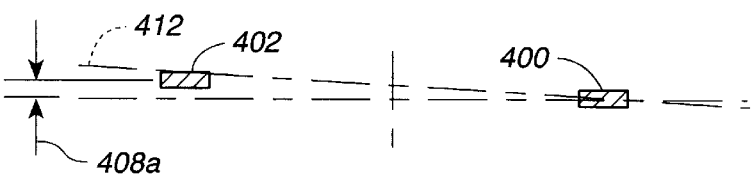
FIG._30
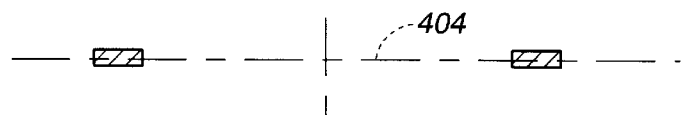
FIG._31
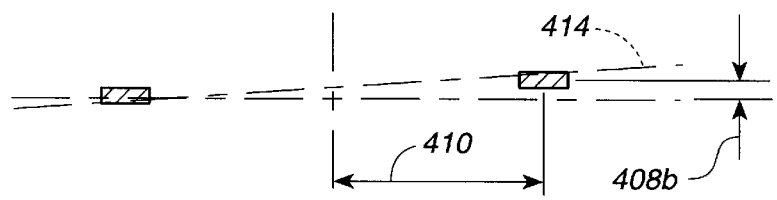
FIG._32
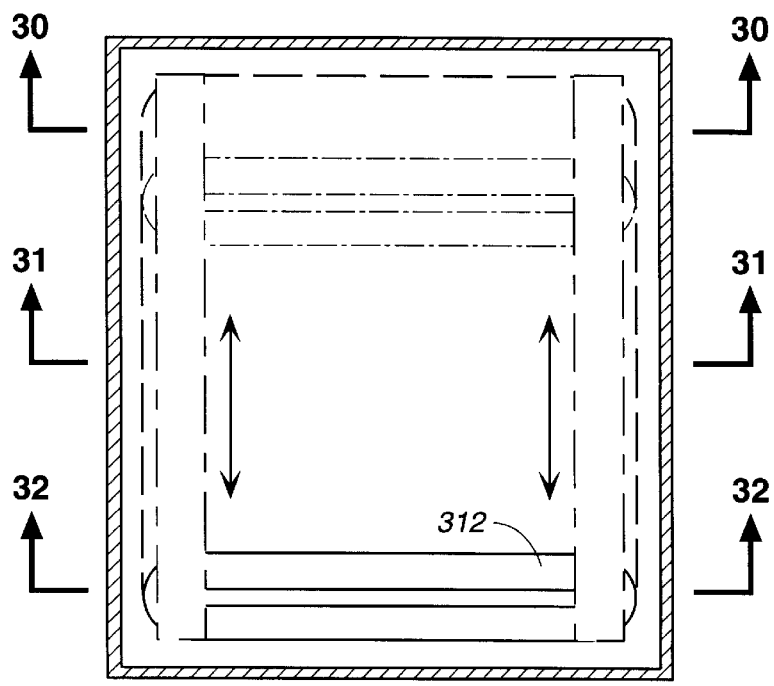
FIG._33

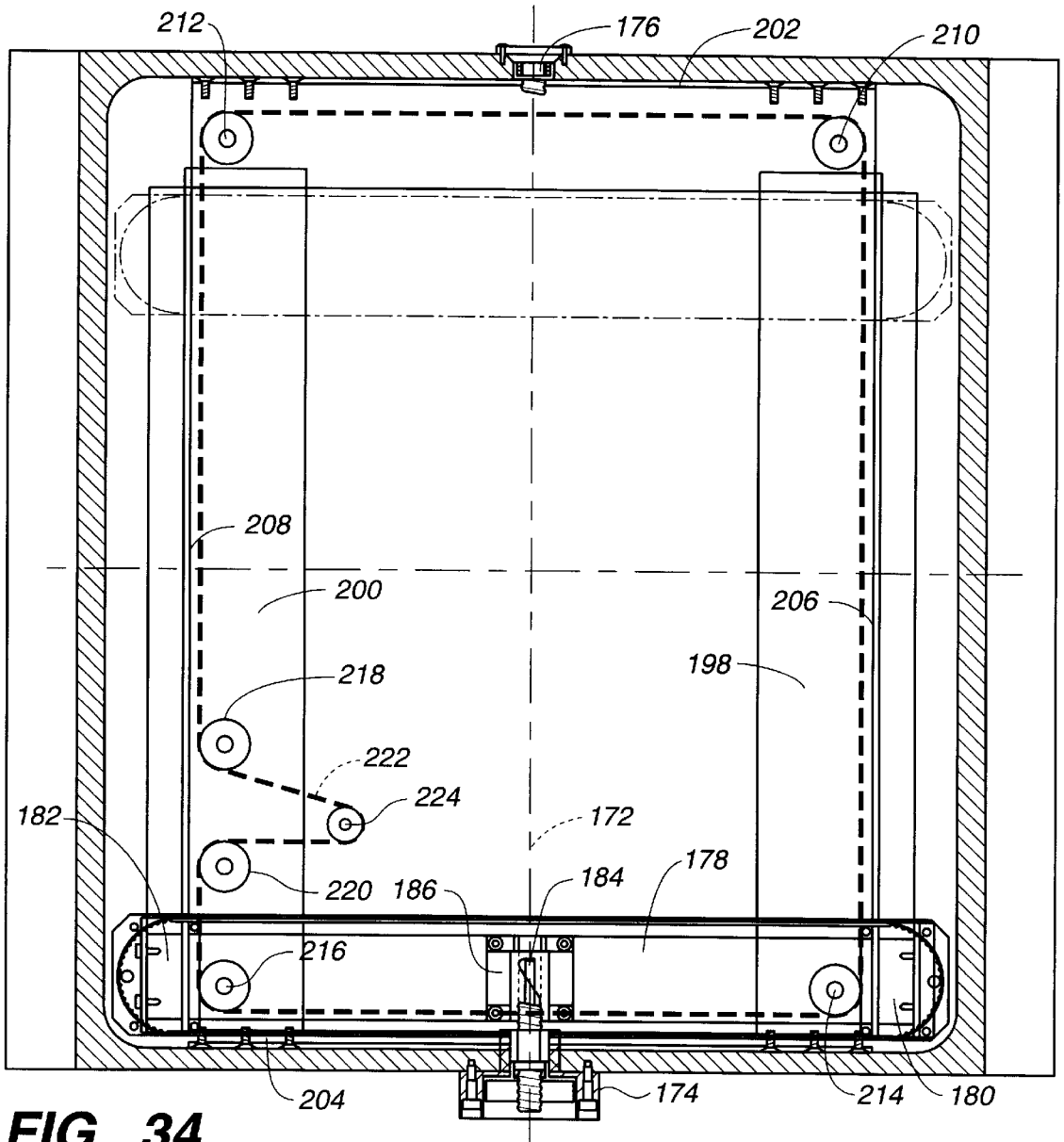
FIG._34
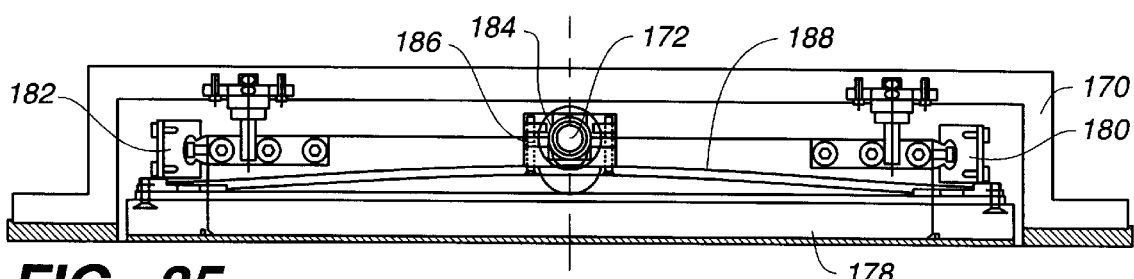
FIG._35

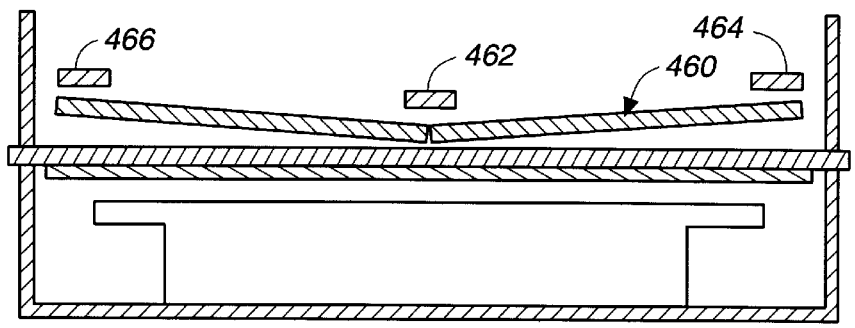
FIG._36
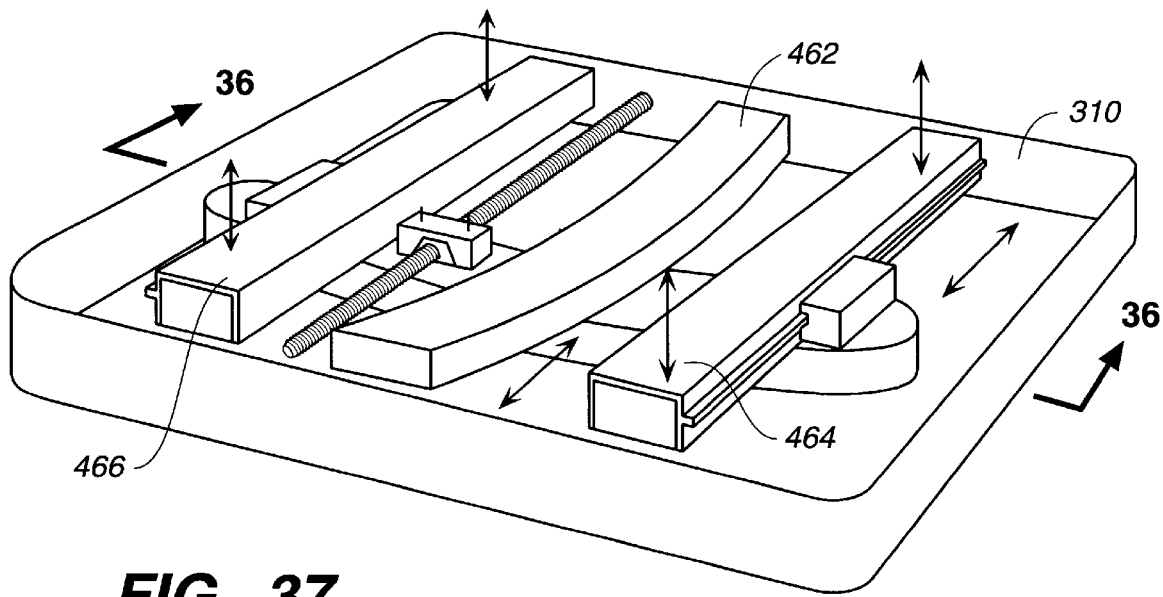
FIG._37

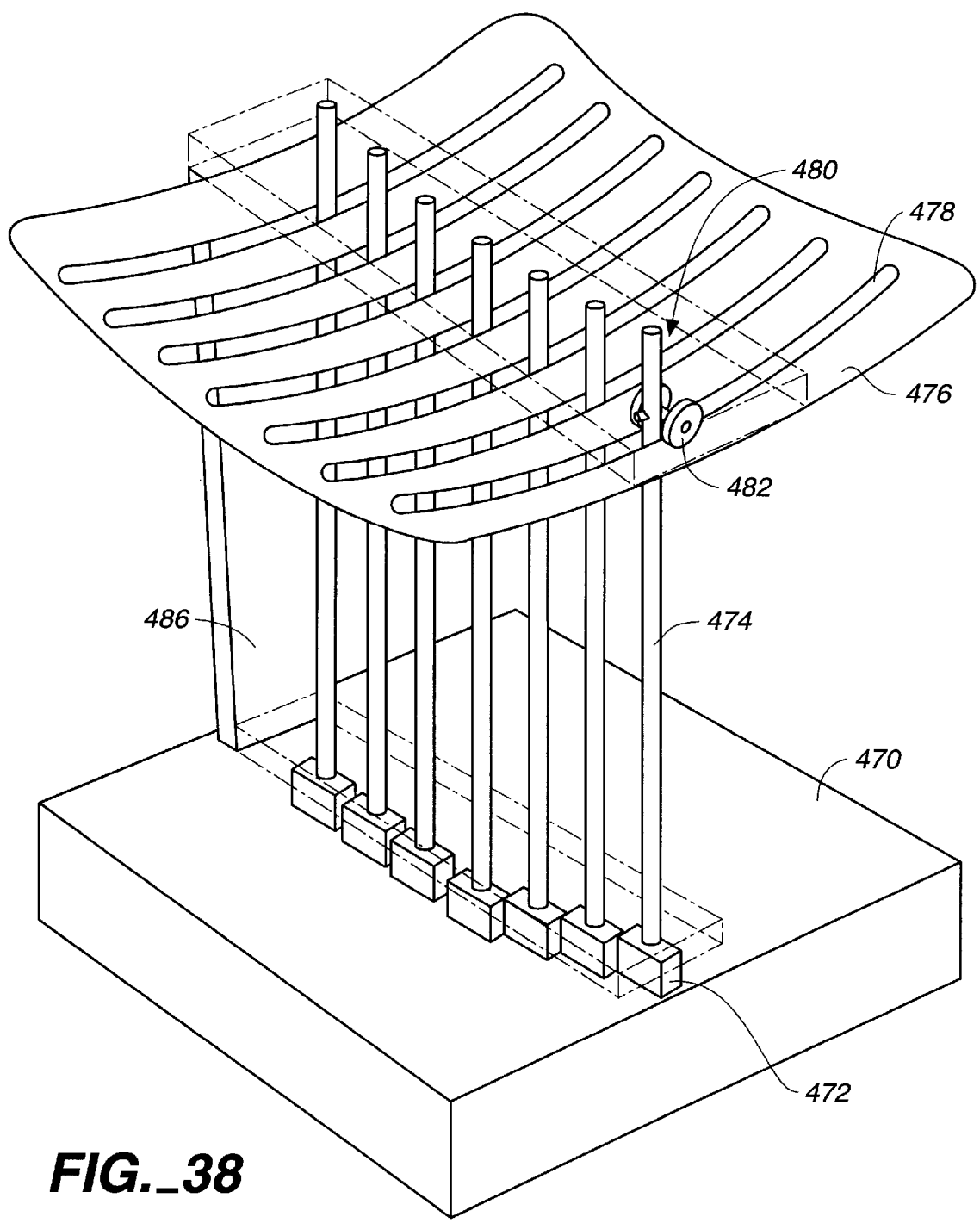
FIG._38

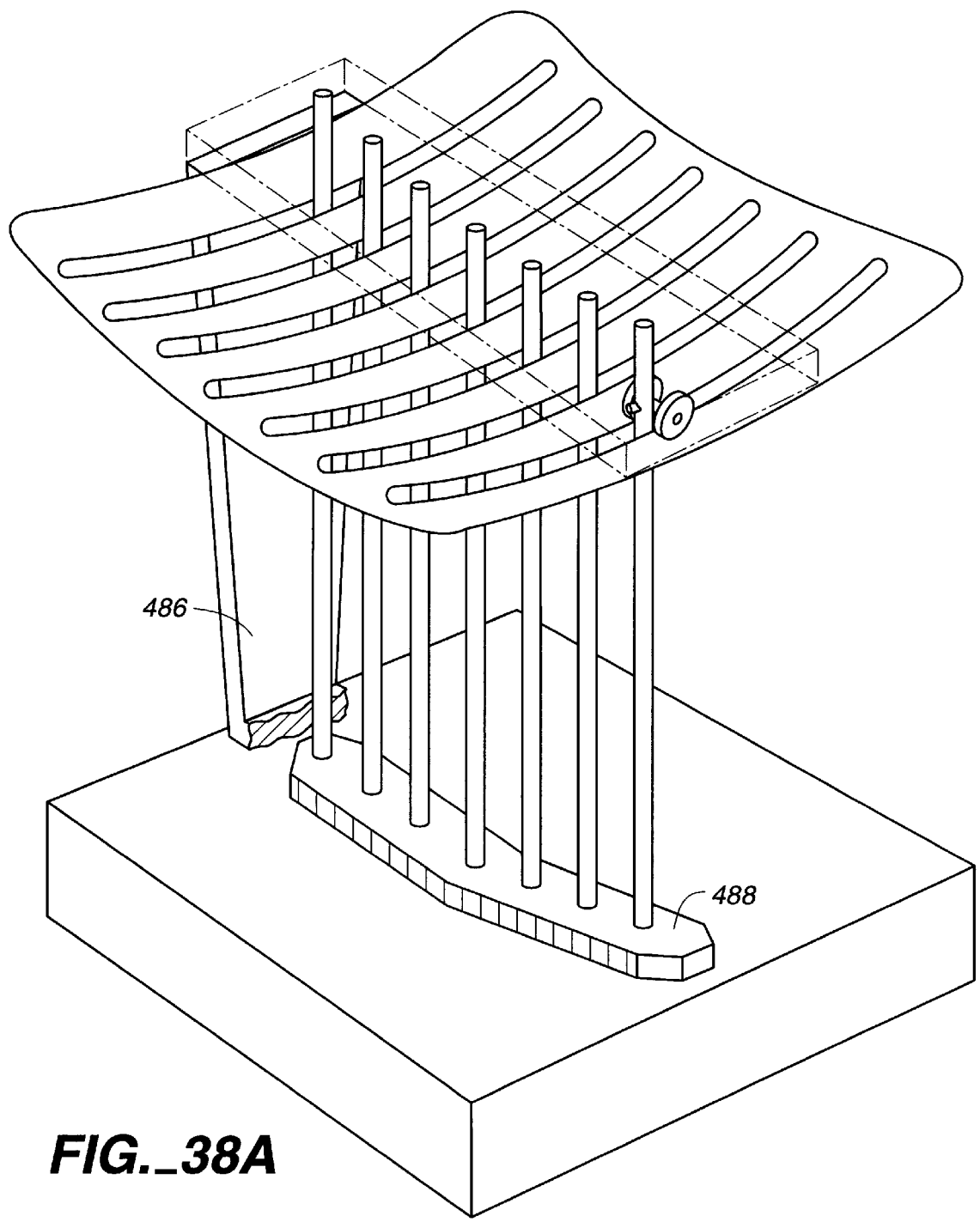
FIG._38A

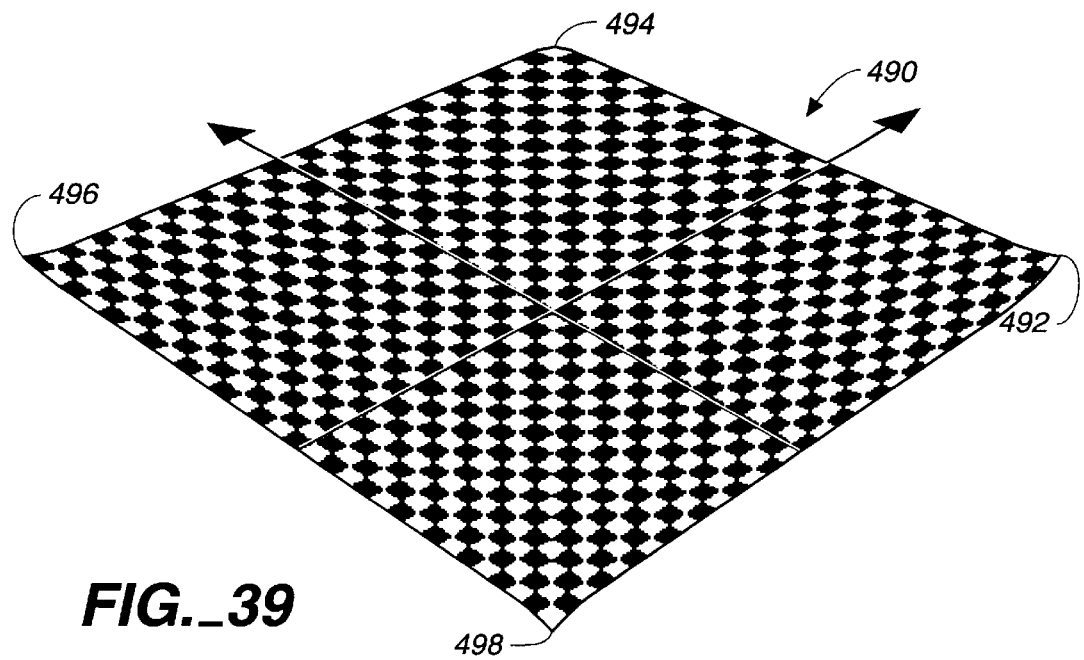
FIG._39
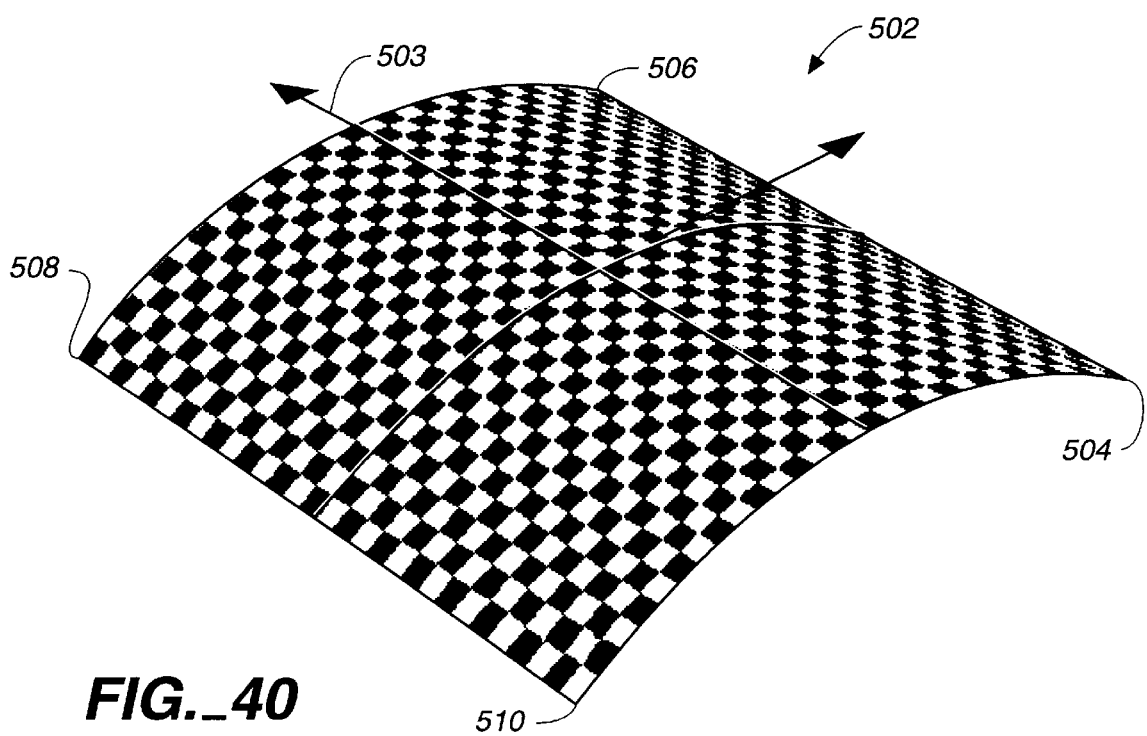
FIG._40

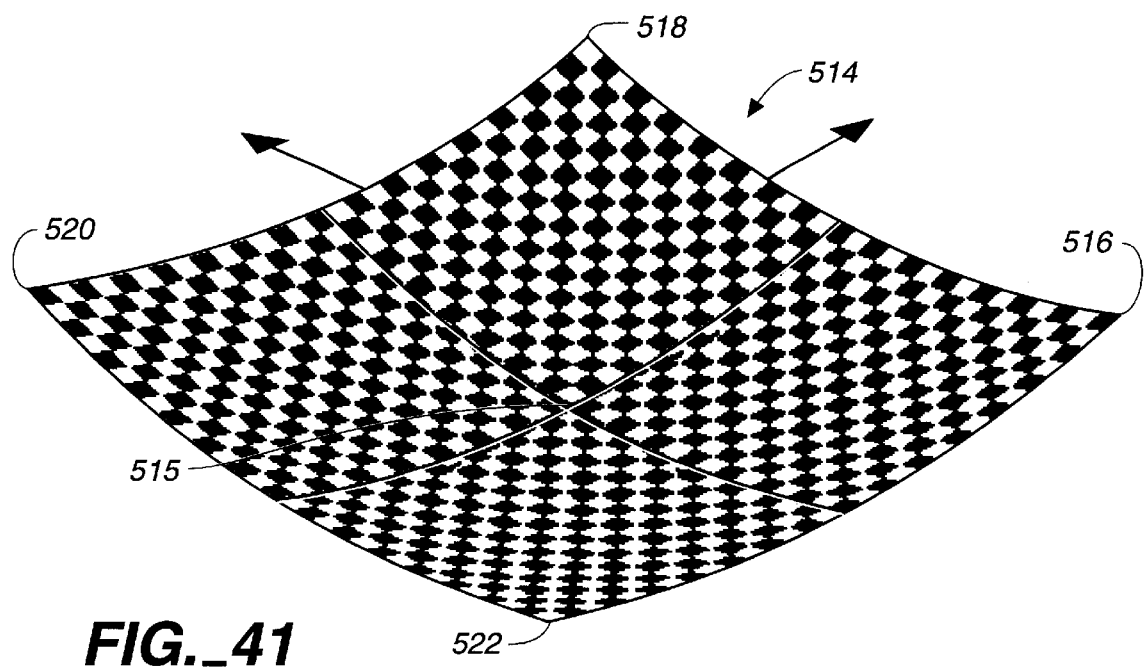
FIG._41
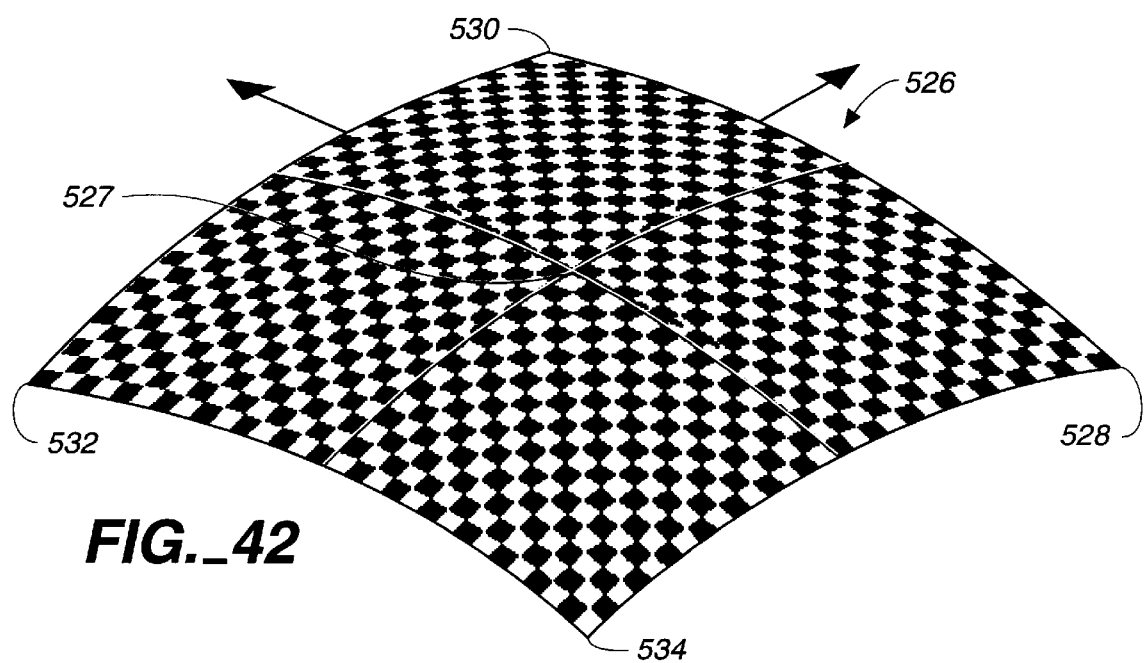
FIG._42

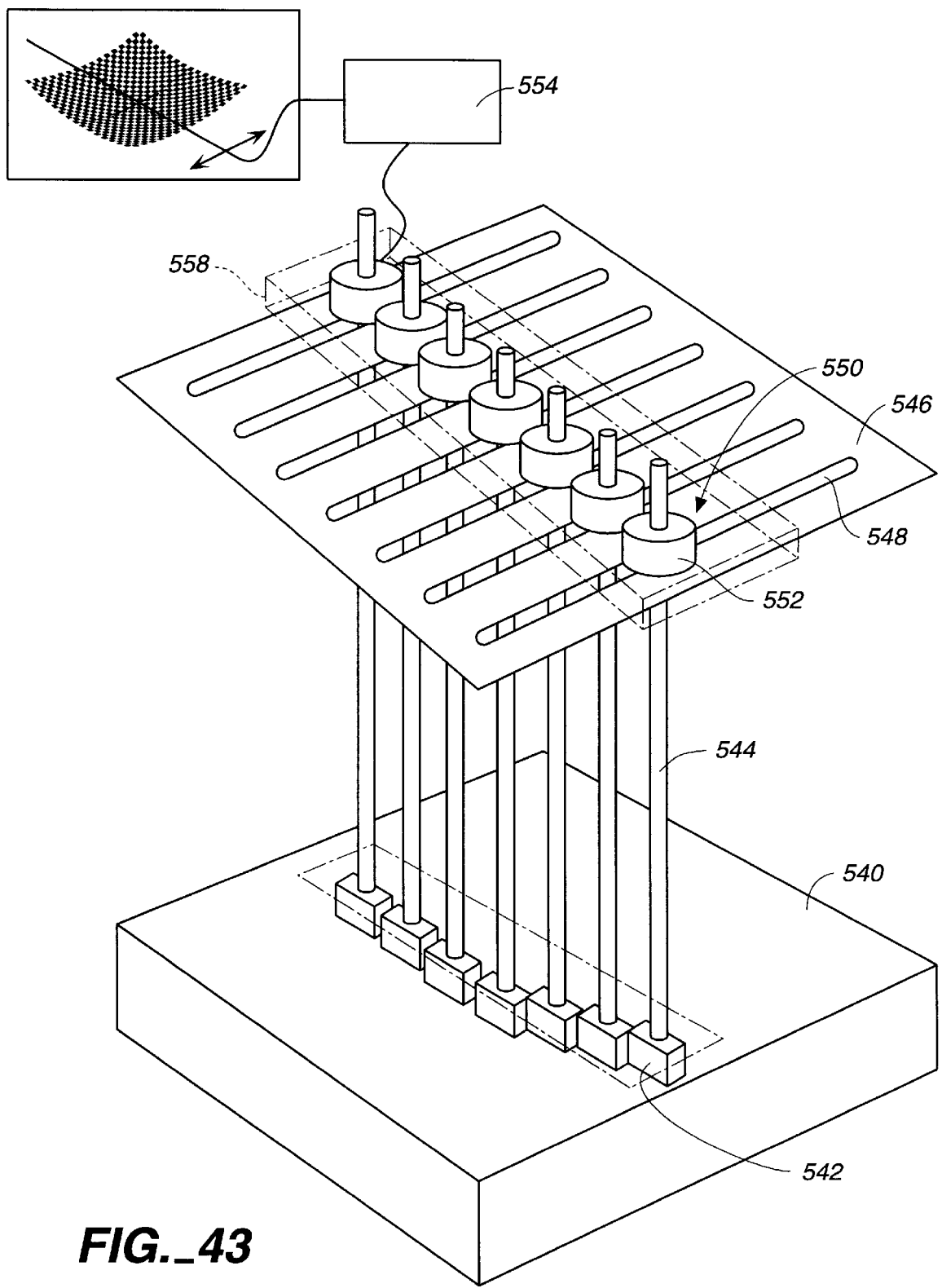
FIG._43

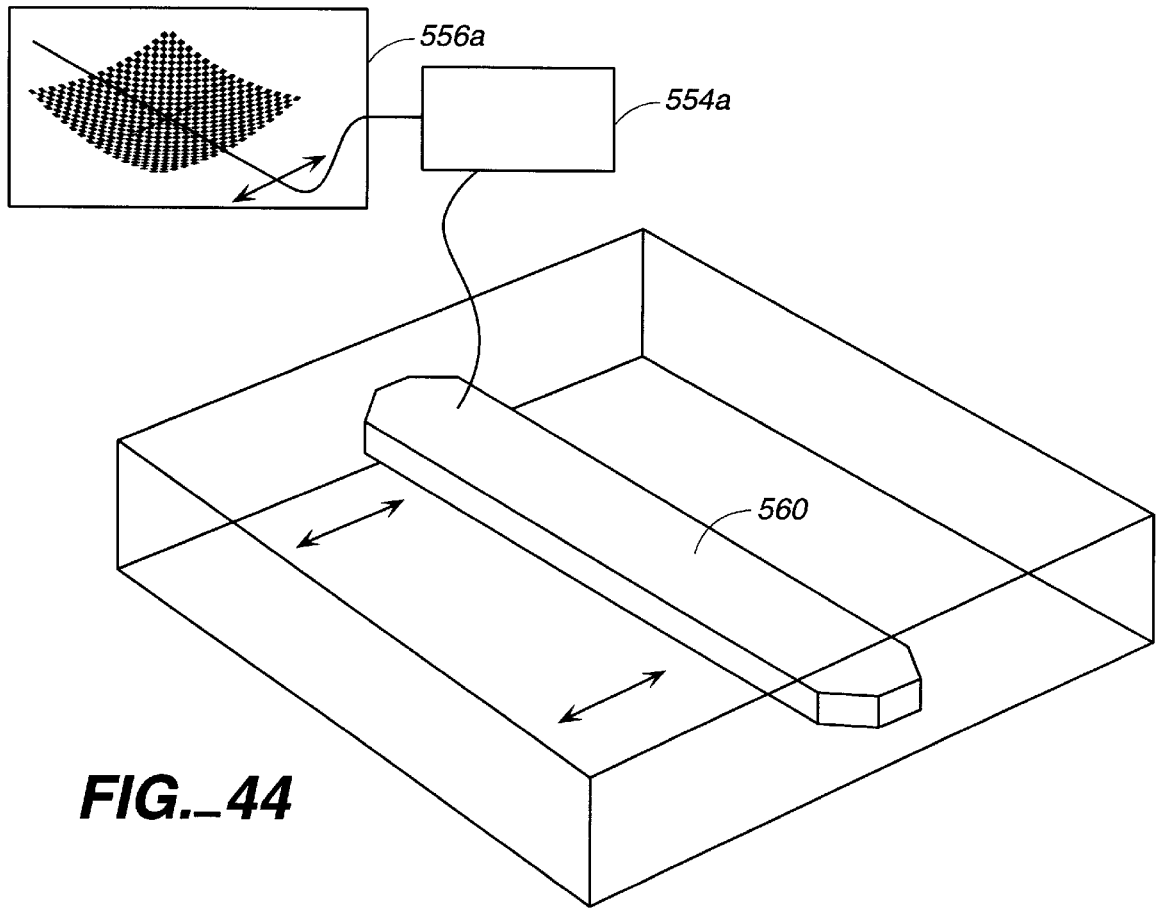
FIG._44
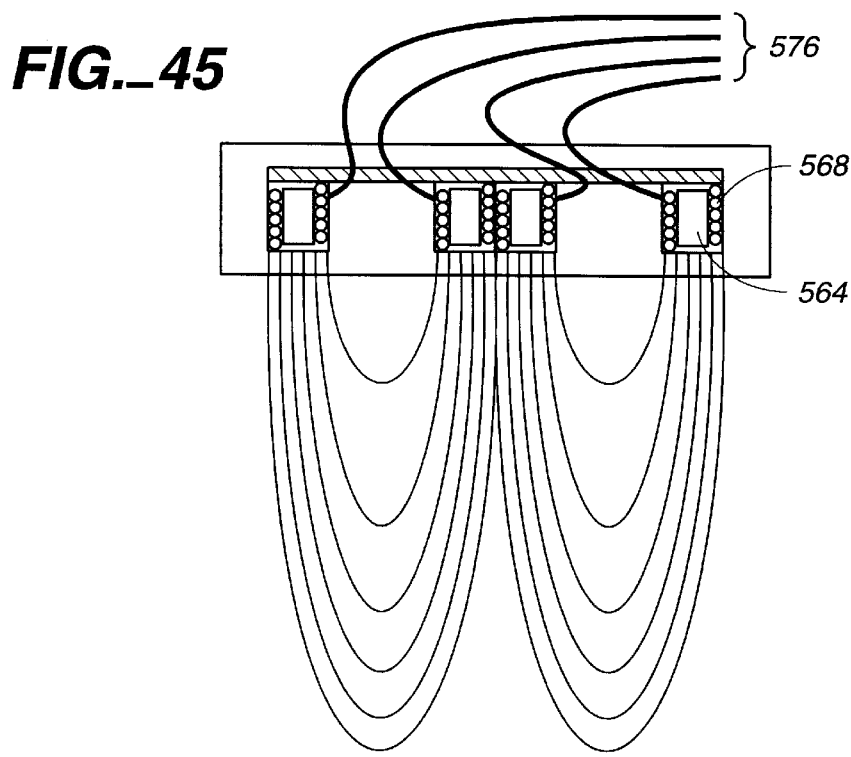
FIG._45

5,855,744

NON-PLANAR MAGNET TRACKING DURING MAGNETRON SPUTTERING

FIELD OF THE INVENTION

This invention relates to the field of magnetrons and particular configurations for their use with sputtering chambers to control film thickness for sputter deposited film. In particular this invention relates to controlling the deposited film thickness on substrates by varying the distance between a portion of the permanent magnets comprising the magnet array in the magnetron and the sputtering target as the magnetron moves laterally across the back of the sputtering target during sputtering.

BACKGROUND OF THE INVENTION

Sputtering describes a number of physical techniques commonly used in, for example, the semiconductor industry for the deposition of thin films of various metals such as aluminum, aluminum alloys, refractory metal suicides, gold, copper, titanium, titanium-tungsten, tungsten, molybdenum, tantalum and less commonly silicon dioxide and silicon on an item (a substrate), for example a substrate or glass plate being processed. In general, the techniques involve producing a gas plasma of ionized inert gas "particles" (atoms or molecules) by using an electrical field in an evacuated chamber. The ionized particles are then directed toward a "target" and collide with it. As a result of the collisions, free atoms or neutral or ionized groups of atoms of the target material are released from the surface of the target, essentially liberating target material are released from the surface of the target, essentially liberating atomic-level particles from the target material. Many of the free particles which escape the target surface condense and form (deposit) a thin film on the surface of the object (e.g. wafer, substrate) being processed, which is located a relatively short distance from the target.

One common sputtering technique is magnetron sputtering. When processing substrates using magnetron sputtering, sputtering action is concentrated in the region of the magnetic field on the target surface so that sputtering occurs at a higher rate and at a lower process pressure than possible without the use of magnets. The target itself is electrically biased with respect to the substrate and chamber, and functions as a cathode. Objectives in engineering the cathode and its associated magnetic field source include uniform erosion of the target and uniform deposition of pure target material on the substrate being processed.

If, during sputtering, magnets generating a magnetic field are stationary at a location, then continuous sputtering consumes a disproportionate fraction of the sputtering target thickness at that location quickly and generates hot spots at the locations of sputtering. Therefore magnets are continuously moved across the back side of the target in a path designed to cause uniform utilization of the target's surface and sputter deposit a correspondingly uniform film thickness on the substrate being processed. Sputtering a target creates a deposition pattern on the substrate which generally matches the utilization (erosion) pattern on the target surface.

To avoid contamination of the processing chamber and substrate processed therein, sputtering is stopped before the non-uniform sputtering wear pattern has consumed the full thickness of the target material at any point. If any point on the plate behind the target were to be reached, sputtering of the target backing plate material (often copper) would occur, contaminating the vacuum chamber and the substrate being processed with the target backing material. Because of the non-uniform pattern of target utilization, sputtering is usually stopped when a large percentage of the target remains.

As the target erodes, the distance between the target surface (which is eroding away) and the substrate being sputtered is slowly increasing. The change in the distance between the target surface and the substrate being sputtered creates a change in the qualities of the sputtered material deposited and its uniformity. When material is deposited on large areas such as glass plates, variations in the thickness of deposited sputtered material are measurable and, may be unacceptable.

In generating the gas plasma and creating ion streams impacting on the cathode, considerable energy is supplied. This energy must be dissipated to avoid melting or nearly melting the structures and components involved. A common technique used for cooling sputtering targets is to pass water or other cooling liquid through a fixed internal passage of the sputtering target. Another cooling technique which is commonly used is to expose a back side of a target to a cooling bath. Cooling liquid circulating through the bath container assists in controlling the temperature of the back of the target assembly. A magnet assembly (magnetron) located on the back side of the target with a backside cooling bath moves within the liquid of the cooling bath.

FIGS. 1, 2, and 3 show a prior art sputtering chamber 50 in which a rectangular substrate 64 (shown in dashed lines in FIG. 1) is supported on a pedestal 52. A target assembly 58, consisting of a target backing plate 56 and a target 54 having a front face facing the pedestal 52, covers the upper flange of the processing chamber sealing it. On the side of the target assembly opposite from the pedestal 52 a magnetron chamber 60 encloses a magnetron assembly 62. The magnetron chamber 60 can be made vacuum tight to reduce the differential pressure across the target assembly 58 (with cooling fluid being routed through the target assembly), or it can be filled with cooling liquid to provide a cooling bath in contact with the back side of the target assembly 58. To enhance sputtering of a rectangular shaped substrate 64 (generally matching the shape of the outside of the chamber 50) the magnetron assembly 62 is a linear bar with rounded ends. The magnetron assembly 62 moves in a horizontal, back and forth (reciprocal) pattern within the magnetron chamber 62 as shown in by the arrows 68. The magnetron assembly passes through the magnetron chamber 62 and to the dashed outline of the magnetron assembly 62a. The outline of the area covered by magnetron movement is shown by the dashed line 66.

The magnetron assembly 62 as shown in FIG. 3 runs parallel to the target assembly 58 along one of a range of elevations between the low and high extremes (e.g., 96, 98), which are greatly exaggerated in this figure. The particular elevation (e.g., 96, 98) is dependent on the desired distance 92 from the front face of the target 54, which in turn determines the degree of sputtering enhancement desired for a particular process chamber pressure and sputtering process being used.

A conceptualized illustration of the magnetic field present around the strong Neodymium Boron Iron magnets used in the magnetron assembly is shown in the cross section of FIG. 4. The positive poles 72, 74, 76, 78 of the magnets shown, e.g., 70, are on the top (away from the sputtering target) in the outside loop 84 (FIG. 1) of permanent magnets and on the bottom (close to the sputtering target) in the inside loop 82 (FIG. 1), although the polarities may be reversed. A magnet backing plate 80 bridges the magnetic field on the top side of the magnetron thus preventing the magnetic field from extending up from the top side of magnetron assembly. In contrast, the magnetic field on the bottom side between adjacent magnets is conceptualized by the loops 86 showing a diminishing magnetic field strength farther down from the magnetron assembly 62. The loops of the magnetic field lines 86, portray a comparatively strong magnetic field in the loop 88 adjacent to the magnets, and drop off in the magnetic field strength rapidly as a function of the distance to a comparatively weakened magnetic field strength at the loop 90 farthest from the magnets. (The loops show an approximation of the diminution of the magnet field strength with distance). Any vertical movement of the magnetron assembly 62 that increases the distance between the front face of the target and the magnetron assembly 62 from the distance 92 (FIG. 3) to the distance 94 (FIG. 5), reduces the magnetic field strength at the surface of the target facing the pedestal 52 by a factor of approximately 5, relative to the range of field strength loops shown in FIG. 4.

FIG. 6 shows a target erosion profile for a target of 6061 Al in 2000 kilowatt hour power range. The contours shown by the plot show a generally uniform utilization of the target with a slight increase in erosion near the ends of the profile (a dwell location). The pattern observable from at the dwell locations corresponds to the shape of the magnet field emanating from magnetron assembly. The target erosion profile as shown here is related to the rate of deposition and film thickness uniformity or thickness control on a substrate being sputtered located opposite such a target (areas showing greater erosion on the target result in areas having greater deposition on the substrate). In this particular instance, there are two areas of relatively high erosion, one at the upper right corner 242 and the other at lower left hand corner 244 of FIG. 6, which produce corresponding deposition thickness anomalies on the substrate being sputtered.

The current specifications for target film thickness uniformity (even for large plates, such as the 50 by 60 centimeter plate shown in FIG. 6) is 5% or better. The anomalies of high erosion at the corners of the target as shown by the regions 242, 244 cause great concern in meeting the specification as they distort the film thickness uniformity so that a film thickness uniformity of only approximately 7% can be achieved. To improve uniformity the excessive erosion in the two regions 242, 244 must be reduced or eliminated so that the specification for film thickness uniformity can be met.

The observation of the high erosion in the corners has initiated a great deal of scrutiny without an identification of its true source. The positioning of an array of permanent magnets in the magnetron assembly assures a uniform magnetic field throughout the magnetron assembly. The general uniformity of the magnet field emanating from the magnetron is confirmed by the generally uniform erosion profile across the center of face of the target. Speculation about the source of the reason for the anomaly in the corners included research to determine whether a source of electrical or magnetic field anomalies could be identified. None has been identified.

FIG. 7 is a plot representing the film thickness on the surface of a substrate. It confirms the uniformity of the film thickness on the surface of a rectangular substrate. This plot shows an approximately mirror image correlation with the target erosion profile of FIG. 6.

In the field of thin film deposition, a size of substrates is becoming larger and larger since there is increasing need for larger size LCD screen. For example, current substrate size for production is up to 400 mm×500 mm, however, the size will be expanded up to 600 mm×700 mm or larger in the future.

One of the most difficult tasks in thin film deposition is how to achieve uniform deposition over a substrate. This shortcoming becomes the dominant factor preventing the economical production of larger and larger LCD screens.

The shortcomings in film thickness uniformity or thickness control of the existing sputtering target systems as described above continue to inhibit the wide use of sputtering as an efficient and cost-effective means for applying surface coatings on large substrates.

SUMMARY OF THE INVENTION

A structure and method according to the invention reduces the film thickness anomalies as discussed above.

Where target erosion anomalies occur, a change in the strength of the magnetic field exposed to the target at those locations has been found to improve the uniformity or control the variation in thickness of the deposited film. One way to change the film thickness at any such location is to provide a localized change in the magnetic field strength while maintaining the uniformity of magnetic field strength over the rest of the target area.

A magnet member (the magnetron assembly) is located in proximity to the sputtering target, and is provided with a magnetic member cycling system (drive system), which causes the magnet member to move in a set or recurring pattern. The recurring pattern is defined by a set of points defining a pattern reference surface. The pattern reference surface is defined by a set of lateral coordinates and a set of vertical coordinates of the pattern. The lateral coordinates establish a grid defining the lateral locations at which the vertical coordinates define a set of elevations of the pattern reference surface, either on the reference surface or on an offset reference surface (which is parallel to but offset from the reference surface).

The pattern reference surface includes a divergent portion (a preset pattern of relative motion) having a subset of elevations which fall outside a range of tolerance for parallelism between the pattern surface and a reference surface of the sputtering target. Movement of the magnetron in the divergent portion reduces or increases the magnetron field strength at the surface of the target.

The reference surface of the sputtering target can be its front face. It could be a middle axis of the sputtering target, or it could be a back face. It should be obvious to persons of ordinary skill in the art that the intensity of the magnetic field should be approximately equal over the surface of the sputtering target facing the sputtering chamber. Therefore, the definition of the reference surface of a sputtering target can be any surface real or imagined that can be defined generally by geometric or mathematical means as being parallel to the surface of a sputtering target, whether that surface be straight or curved. It is assumed that such a straight or curved surface is a continuous one (without sudden steps) and is generally used as a reference for parallelism before sputtering occurs (an un-used pre-sputtering configuration), because after sputtering has begun the target erosion will deform the shape of the sputtering target and start to generate differences in the uniformity of film thickness due to small, but detectable, differences in the target erosion rate across its surface.

It may be desirable to have uniform film thickness over some portions of the substrate and have varying thicknesses in other regions. The structure and method according to the invention allows control of the film thickness deposited, by varying the strength of the magnetic field. An approximately uniform film thickness can be achieved, but so can a prescribed pattern of film thickness which is not necessarily uniform, for example one which is thicker at the edges to provide an easier connection to external wiring.

In one configuration, a change in the magnetic field strength can be accomplished when using a two bearing rail system merely by tilting opposite corners of opposing rails in opposite directions (the magnetron acting as a bearing truck between the rails). For example, by providing a high end and a low end on one bearing rail while the opposite bearing rail has its low end opposite the high end of the first bearing rail. Such a tilted configuration will cause a flight path or surface pattern (profile) for the magnetron assembly that includes regions of the surface pattern that fall outside a standard tolerance for parallelism between the magnetron path pattern reference surface and the reference surface of the target. In one configuration the magnetron is tilted in one direction at one end of the back and forth travel, and is tilted in the opposite direction at the opposite end of the back and forth travel. A change in rail elevation as small as 0.020"–0.030" (500–750 $\mu$m) in central regions of the travel has a noticeable effect because of the strength of the magnetic field decreases greatly over a small distance. The effect of a change in the elevation of a linear rail of 0.030" end to end of a 2-foot travel path provides an improvement in the variation in film thickness uniformity from approximately 8% to approximately 3–4% (providing a improvement which meets the 5% specification).

In another configuration, according to the invention, it is possible that when utilizing two bearing rails that they be curved or otherwise patterned to move the magnet member (magnetron assembly or one end of the assembly) close to and away from the target surface in a particularly described pattern to increase and decrease the magnetic field strength to promote an improvement in the control or uniformity of the deposited film thickness.

Utilizing a magnet member moving in the transverse (lateral) direction, it is possible to provide several tracks (more than two) to help guide the magnet member. The magnet member (magnetron) can be divided into two or more sub-sections to assist in maintaining a uniform target profile. For example, it is possible to provide three generally parallel bearing rails (a set of tracks) which support two magnet member sub-sections between them. The outside bearing rails can be relatively flat, while the inside bearing rail could dip down or rise up to change the magnetic field intensity. Similarly, the magnet member could be constructed of a series of magnet member sub-sections (connected in a housing or separate from one another) with each magnet sub-section following the contour of its own rail or path as it moves from one end to the other end of the processing chamber.

In another configuration, a cam plate surface which includes a series of slots and surface followers which are connected to the subsections of the magnet member. Movement of the magnet member from one end to the other causes the elevation of each separate sub-section of the magnet member to follow the pattern of the cam surface. Varying the elevation of various magnet subsections by the use of a mechanical cam surface—follower system can also be reproduced by utilizing vertical activation devices such as motors and vertical drives which cause each magnet member subsection to move vertically according to a pre-programmed contour depending on its lateral location. Such movement could potentially change the sputtering intensity at the ostensible location of sputtering anomalies, which create an uneven erosion profile, to eliminate such anomalies and improve the film thickness uniformity.

It is known that the distance between the face of the sputtering target and the substrate being sputter deposited is one factor in determining the film thickness deposited on the substrate. However when sputtering large substrates, because the center of the target is farther away from the source of sputtering power, and there tends to be a drop in the sputtering intensity at the center of a large target. Therefore, to compensate for this drop, the magnet field at this location (region) could be gradually increased by moving the magnetron closer to the sputtering target at the center to improve the film thickness uniformity.

Another configuration for improving film thickness uniformity is to tilt (roll or pitch) only the end of the magnetron near the end of its travel. The bearing rails supporting the magnetron are kept straight and level and the end of the magnetron is tilted by utilizing a localized ramp (cam) and roller (cam follower). Either the ramp or the roller is located on the end of the magnetron and the ramp or follower is located on a stationary support fixed to the processing chamber. The lateral motion of the magnetron at a particular location causes the cam to engage the cam follower causing a tilting force to be generated. The tilting force pushes the end of the magnetron in a vertical direction to cause the magnet member reference surface to describe the divergent portion. The tilt can be a roll motion or a pitch motion as the terms roll and pitch are understood when referring to an aircraft's attitude—the magnet member (magnetron) relating to a fixed wing on an aircraft.

Electromagnets can be used in the magnetron and the magnetic field of the electromagnets can be varied to cause changes in the strength of the magnetic field to affect and control the film thickness desired.

A method according to the invention includes the steps of moving a magnet member laterally in the proximity of a sputtering target and moving portions of said magnet vertically, a distance greater than a tolerance for parallelism between a reference plane and the plane of motion at selected locations to vary the magnetic field strength causing a divergence from the plane to improve the film thickness control. Another method according to the invention includes the steps of moving a magnet member laterally along a track and moving portions of the magnet member in a vertical direction simultaneously with the lateral motion of the magnet member to change the magnetic field intensity utilized for sputtering at one or more locations along the track to improve film thickness uniformity for sputtering.

These structures and methods provide a degree of improvement in the control of film thickness not known or utilized in the prior art.

BRIEF DESCRIPTION OF THE DRAWINGS

FIG. 1 is a schematic top view of a prior art magnetron enclosure;

FIG. 2 is a cross sectional end view of the sputtering chamber separated from the prior art magnetron chamber of FIG. 1 by the target assembly;

FIG. 3 is a side cross sectional view of the apparatus of FIG. 2 showing the conceptualized magnetic field of the magnetron extending far beyond the sputtering target;

FIG. 4 is a cross sectional view of the magnetron including permanent magnets and a conceptualization of the magnetic field emanating downwardly therefrom;

FIG. 5 is a second side cross sectional view of the apparatus of FIG. 2 showing the magnetron raised up to a higher elevation with the conceptualized magnetic field from the magnetron just barely extending beyond the sputtering target;

FIG. 6 is a prior art target erosion profile showing the pattern of erosion (utilization) of the sputtering target during sputtering;

FIG. 7 shows the film thickness profile on a substrate as determined from a sheet resistance analysis using a five point probe (which is inversely proportional to film thickness) for a sputtering target utilizing the prior art magnetron chamber;

FIG. 8 is a plot of the film thickness contours of a sputtering target assembly from a sheet resistance analysis using a five point probe (which is inversely proportional to film thickness) when using a structure and method according to the invention;

FIG. 9 is a schematic perspective view of a magnetron chamber utilizing a center bearing rail to support the magnetron;

FIG. 10 is a schematic representation showing an exaggerated dimension of the center magnetron support beam of FIG. 9 and its rotation as it travels along the center beam support;

FIG. 11 is a cross sectional view of a magnetron support beam taken at 11—11 of FIG. 14;

FIG. 12 is a cross sectional view of a magnetron support beam taken at 12—12 of FIG. 14;

FIG. 13 is a cross sectional view of the magnetron support beam taken at 13—13 of FIG. 14;

FIG. 14 is a top view of a magnetron chamber according to the invention with a center magnetron support beam;

FIG. 15 is a perspective view of a bearing channel beam with bearing tracks (rails) supported on the central beam as shown for example in FIG. 9;

FIG. 16 is a modified bearing support rail showing the channel being split and being raised one side of each end of the channel to provide the vertical travel of portions of the magnetron;

FIG. 17 shows a top plan view of the end of the magnetron as shown in FIG. 18 as it about to engage the ramp (cam) to be lifted;

FIG. 17A shows a top plan view of the end of the magnetron as shown in FIG. 18A as it about to engage the ramp (cam) to be lifted;

FIG. 18 is a partial cross sectional view of a magnetron chamber taken at 18—18 of FIGS. 20 and 24, showing the ramp which raises the end of the magnetron at opposite ends of the chamber;

FIG. 18A is a partial cross sectional view of a magnetron chamber taken at 18A—18A of FIGS. 20A, showing the ramp which tips the edge of the magnetron at opposite ends of the chamber;

FIG. 19 shows a cross sectional side view showing the position of the ramp in relation to the magnetron;

FIG. 20 shows the top plan view of the magnetron chamber having a magnetron whose ends are subject to being raised by ramps at opposite corners;

FIG. 20A shows the top plan view of the magnetron chamber having a magnetron whose ends are subject to being raised by ramps at its corners;

FIG. 21 shows a schematic cross section of a deformable horizontal magnetron whose end is bent up in a curved shape, taken at 21—21 in FIG. 24;

FIG. 21A shows a schematic cross section of a rigid horizontal magnetron whose end is raised up, taken at 21—21 in FIG. 24;

FIG. 22 is a schematic cross sectional view of the deformable horizontal magnetron, taken at 22—22 in FIG. 24;

FIG. 22A is a schematic cross sectional view of the rigid horizontal magnetron, taken at 22—22 in FIG. 24;

FIG. 23 is a cross sectional view of the deformable horizontal magnetron whose end is bent up, taken at 23—23 in FIG. 24;

FIG. 23A is a cross sectional view of the rigid horizontal magnetron whose end is bent up, taken at 23—23 in FIG. 24;

FIG. 24 is a schematic top view of a magnetron chamber where the magnetron is supported near its center, including ramps at opposite corners to influence the vertical position of the end of the magnetron when the magnetron is moved near either end of its travel;

FIG. 25 is a bottom plan view of a magnetron chamber utilizing a central beam support for the magnetron track;

FIG. 26 is a cross sectional view of the magnetron chamber of FIG. 25;

FIG. 27 is a schematic perspective view of a magnetron chamber enclosing a traveling magnetron supported by two horizontal beams near its ends;

FIG. 28 is a schematic representation of the elevation change (rotation) of the magnetron as it travels one end to the other along inclined tracks as shown in FIG. 27;

FIG. 29 is a schematic cross sectional view of a magnetron supported from two generally parallel rails (tracks) according to the invention;

FIG. 30 is a cross sectional view showing the magnetron support rails and magnetron attitude, taken at 30—30 in FIG. 33;

FIG. 31 is a cross sectional view showing the magnetron support rails and magnetron attitude, taken at 31—31 in FIG. 33;

FIG. 32 is a cross sectional view showing the magnetron support rails and magnetron attitude, taken at 32—32 in FIG. 33;

FIG. 33 is a schematic top view of a magnetron chamber where the magnetron is supported near its ends by two horizontal support rails;

FIG. 34 is a bottom plan view of a magnetron supported along two generally parallel beams at the edges of the magnetron chamber;

FIG. 35 is a cross sectional end view of FIG. 34;

FIG. 36 shows a cross sectional view of a hinged magnetron in a magnetron chamber, for example as shown in FIG. 37;

FIG. 37 shows a schematic perspective view of a hinged magnetron with a bowed down center track according to the invention;

FIG. 38 shows a moving magnetron assembly (device) having permanent magnet sub-sections whose vertical travel is influenced by a contour plate which changes the vertical spacing between each magnet sub-section and the target during sputtering as the magnetron moves laterally;

FIG. 38A shows a moving magnetron assembly (device) having a deformable magnetron connected through several cam follower linkages to a contour plate, the vertical travel of portions of the magnetron connected to the cam follower linkages is influenced by a contour plate which changes the vertical distance between each portion of the magnetron and the target during sputtering as the magnetron moves laterally;

FIG. 39 provides an alternate conceptualized magnetron reference surface pattern for a contour plate showing high points at the right and left corners and low points at the front and back corners of the conceptualized plate shown;

FIG. 40 shows a conceptualized magnet reference surface pattern having a lateral central axis in a parabolic or circular concave down type shape with all paths perpendicular to the lateral axis being equal lengths;

FIG. 41 shows a conceptualized magnet bowl-shaped type parabola pattern plate for use as a magnet section guide, the shape being similar to the shape pictured in FIG. 38;

FIG. 42 shows a conceptualized reference surface pattern convex surface to use as a magnet pattern contour plate;

FIG. 43 shows a flat magnet contour plate assembly utilizing activators for raising and lowering the magnet sections individually using electrical or other activators according to a pre-programmed pattern;

FIG. 44 shows an magnetron whose magnets are electromagnets, the strength of the magnetic field is controlled by varying the electrical energy supplied to each electromagnet segment in the magnetron as the magnetron moves laterally during sputtering; and FIG. 45 shows a cross section of an electro-magnetic magnetron according to the invention as used in the configuration of FIG. 44.

DETAILED DESCRIPTION

An understanding of the improvement the invention provides results from comparison of the film uniformity plots of FIGS. 7 and 8. In the plot 250 of FIG. 7 the plots of the contour shows several heavy black contour lines showing the film thickness variation across areas of the substrate as the thickness is plotted from a center to an edge of the substrate. The non-symmetrical (skewed) plot shows that the upper left corner and the lower right corner depositions include severe variations at those locations. The variation in film thickness uniformity for the analysis of FIG. 7 being approximately 8%. In comparison a similar plot 260 using a structure and method according to the invention results in the film uniformity plot as shown in FIG. 8. The plot from the analysis is now generally symmetrical about the center and is rectangular without being skewed. The thickness variation from center to the edge being approximately equal on both sides of a vertical center axis. FIG. 8 provides a smaller distance between the maximum and the minimum than the plot of FIG. 7. The resulting variation in film thickness uniformity being approximately 4%.

Single Beam Bearing Support

FIG. 9 shows a perspective schematized view of a device according to the invention wherein a magnetron assembly 272 is moved within a magnetron chamber 270 in the direction shown by the arrows 274. The magnetron assembly 272 is supported on a central bearing support beam 276 which can be moved vertically uniformly as shown by the arrows 278. A set of bearing rails, (e.g., 382, 384) supports the magnetron assembly 272 through a set of bearing truck receiving members (e.g., 282). The lateral motion of the magnetron assembly is produced by turning a threaded drive rod 284 which is engaged with a threaded drive nut 286 contained in a threaded drive nut housing 288. The threaded drive nut housing engages and can slide vertically on a pair of connecting pins 290a, 290b, which are fixed to and extend upwardly from the top of the magnetron assembly 272. The sliding connection between the connecting pins 290a, 290b and the threaded drive nut housing 288 accommodates differential vertical motion between the threaded drive rod 284 which is fixed to the walls of the magnetron chamber 270 and the magnetron 272 supported by the support beam 276. The sliding connection allows vertical motion of a portion of the magnetron as it cycles from end to end and tips as it cycles as shown in FIG. 10.

FIG. 10 shows an idealized exaggerated schematic perspective view of the motion of the magnetron assembly as shown in FIG. 9. The magnetron assembly 300 moves laterally (horizontally in this case, but the lateral motion could be across a curved (e.g., spherical) substrate surface as well) supported on a central bearing support rail 302 showing a twist from end to end. Dashed lines 304, 306 show a change in the elevation of the ends of the magnetron assembly (roll—as that term is understood for aircraft motion) as the magnetron 300 moves laterally from one end of the chamber to the other. As the magnetron assembly 272, 300 moves from one end of the processing chamber to the other, its left and right ends rise and fall, respectively, thus becoming farther from and closer to the target assembly, respectively. The end (a portion) of the magnetron assembly that is farther from the target surface reduces the magnetic field influence enhancing sputtering, while an end of the magnetron that is closer to the target surface increases the magnetic field influence enhancing sputtering. This end to end tilting arrangement provides greater influence on sputtering at opposite corners of opposite ends of the magnetron chamber and magnetron respectively as the member moves from laterally from end to end.

Conventional thinking requires the magnet field strength to be held constant over the whole area of the target as the magnetron moves. Such thinking imposes a specification for flatness of the tracking or parallelism between the path of the magnetron and a reference surface (usually the front surface) of the target. The parallelism between members is intended to provide a constant magnetic field. Specification of the range of the usual tolerance for flatness or parallelism which is usually approximately 5 thousandths of an inch in 1 foot or less, is utilized to help define an aspect of the invention according to the claims. Such tolerances also exclude variations in alignment due to natural variation in manufacturing and practical limits in aligning of mechanically mating pieces. The actual difference in elevation of the ends of the magnetron according to the invention can be quite subtle. Variations in elevation slightly falling outside the natural range of the tolerance of the specification for flatness or parallelism as slight as 0.0075" per foot will have an effect on film thickness uniformity, because the magnetic field strength varies strongly with the distance. A localized variation in elevation will have a localized effect. The localized variation can be defined as a divergent portion (that portion of the reference surface of the magnetron motion that exceeds the tolerance for flatness or parallelism, both of which under normal circumstances are defined as plus or minus 0.005" elevation variation per lateral foot or less, less than 0.05%).

Therefore a configuration according to the invention can be defined in terms of the tolerance for flatness or parallelism. The imaginary surface formed by the lateral and vertical motion of the magnetron is evaluated for flatness or for parallelism against a reference surface. A configuration according to the invention provides that the imaginary surface include a divergent portion which has vertical components of the imaginary surface which fall outside the range of the conventional tolerance for flatness and/or parallelism and as a result of the motion of the magnetron in the divergent portion the motion produces an improvement in the uniformity of film thickness deposited on a substrate. Because the magnetic field strength varies strongly as a function of distance from the magnetron, progressively larger departures from flatness or parallelism create progressively larger changes in the film thickness achieved. A departure from flatness or parallelism of 0.030" at the end of the magnetron track, or as much as approximately 10 mm out of plane at the end of the magnetron, for the configuration of FIG. 9, results in changes in film thickness uniformity at opposite corners of the substrate and target which provide an observable improvement when compared to the plot of FIGS. 7, (the setup in FIG. 7 having the normal maximum range of 0.010" from rail end to rail end, when the tolerances for flatness or parallelism are met). The elevation change provides an improvement in film thickness uniformity to meet the specification requirements of a 5% variation, as shown in FIG. 8.

While this example provides one configuration of the invention, this same technique can be used at other locations where the film thickness uniformity or thickness control needs to be improved. The motion of the magnetron is adjusted so that the imaginary surface pattern describing its motion includes divergent portions which exceed the normal tolerances for flatness or parallelism and create a change in the magnetic field at the surface of the target being sputtered, so that the film thickness uniformity or thickness control deposited on the substrate is improved.

The vertical motion of a portion exceeding the specification for flatness and for parallelism from end to end and side to side is measured against an imaginary reference surface superimposed on the imaginary reference surface pattern/profile created by the motion of the magnetron assembly 272. An elevation view showing the characteristics of the motion of the magnetron assembly 272 departing from flatness or parallelism is shown in FIGS. 11, 12, and 13 for tilting of a linear magnetron assembly 272, and in FIGS. 21, 22, and 30 for the bending of the magnetron assembly 272. In both configurations the ends of the magnetron assembly 272 near the end of its travel is raised to exceed the normal (or otherwise selected) tolerance (e.g., 0.005"/ft, 0.0075"/ft, 0.010"/ft, 0.015"/ft, 0.020"/ft, 0.025"/ft, 0.030"/ft, 0.0035"/ft, 0.040"/ft, or 0.0050"/ft (producing an approximately 10 mm change in elevation at the end of the magnetron)) to provide an improvement in the film thickness uniformity or thickness control across the surface of the substrate which is being sputter deposited.

FIG. 11, 12, and 13 are progressive sectional cuts showing the attitude (tilt or bend—roll) of a magnetron assembly 272 as it moves from one end to the other end of the magnetron chamber 270 as shown in FIG. 9. The center support rail 276 supports a one-piece bearing frame 380 as shown in FIGS. 9 and 15. Generally speaking, the bearing rails 382, 384 are constructed to be fixed parallel to one another. However, if a portion of the bearing rail as shown in FIG. 16 is cut along a split separation 392 in the top of the channel, between the holes pictured therein, and shims typically multiples of 0.010" up to 0.060" depending upon the process, e.g., 0.050", for example 394, 396, are positioned and fixed in place between the center bearing support beam 276 and the one-piece bearing frame 380 on opposite sides at opposite ends. The shims cause a slight vertical bend in the bearing rails 382 and 384. The slight vertical offset 371 (FIG. 13) at the center bearing support is amplified as the magnetron projects further outward towards its end, where the vertical offset is a maximum (approximately 10 mm). The configuration of the bearing rails 382, 384 causes the magnetron assembly 272 to follow the path of the rails. Movement of the magnetron creates a series of points in an imaginary surface pattern (flight path) tracing the position of each point of the magnetron assembly 272 as it moves laterally. Some of the points in the imaginary surface pattern are vertically offset from an imaginary horizontal plane (in which the magnetron assembly would move if its bearing rails were not vertically offset from the neutral axis 368 (see FIG. 12) of the lateral motion and intersecting with the pattern of the horizontal reference plane) a distance greater than a tolerance for flatness or parallelism with a reference surface. The vertical adjustment to the bearing rail position can also be done by using vertical slots through which bolts are tightened in the side of the one-piece bearing frame instead of or in addition to the shims 394, 396.

As shown in FIG. 13, the offset in the vertical direction of the left side split bearing rail frame 360 in a vertical direction by a distance 370 causes the magnetron assembly to assume a roll attitude as shown by the dashed line 372. The offset of the bearing rail from a central axis 364 is set by a distance 366. Similarly in FIG. 11 a right side split bearing rail 362 is shown such that the offset of the bearing rail on the right side from a central axis 368 by a distance 371 (approximately 10 mm) provides a magnetron roll attitude as shown by the dashed line 374. Thus, a small change in elevation near a central support will provide a much larger change in elevation at the extreme end of the magnetron assembly 272 extending out far beyond the central support rail 276.

FIGS. 17–20, 17A, 18A, 20A, and 21–24 show another configuration of a magnetron supported on a central support beam 276 according to the invention. In this configuration instead of tilting the bearing rails, the bearing rails are maintained in their original flat horizontal attitude which without interference would provide a planar flat travel path for the magnetron parallel to a reference surface of the target assembly. In this configuration the magnetron assembly 272 is supported not just from the central bearing support beam 276, but as the magnetron assembly approaches the ends of the chamber a cam follower (roller) 442 engages a ramp (cam) 422 so that the end of the magnetron assembly is bent or tilted upwards away from the sputtering target assembly. Ramps 422, 428 are positioned at opposite corners of the chamber, corresponding to the locations on the sputtering target where the excessive erosion anomaly is observed (FIG. 6). In one configuration a rigid generally non-deformable magnetron housing can be used with a spring loaded joint to hold the magnetron to the bearing trucks of the center bearing rails. The springs are loaded to hold the magnetron straight and level with the bearing rails, and to allow hinging with a pivot axis at the center bearing rail when the end of a magnetron comes in contact with a cam to raise it. In another configuration the magnetron housing is made of an easily deformable plastic, rubber or other similar material, with a rigid connection at the center rail to the center bearing truck(s), such that when the magnetron end comes in contact with a cam (i.e., 422) it bends in a curve and to raise the end of the magnetron away from the target assembly. Compare the roll attitudes shown in FIGS. 21 versus 21A and 23 versus 23A.

FIGS. 17, 17A, 18, 18A, 19, 20, and 20A are a series of related cross sectional schematic views showing the motion of the end of the magnetron assembly 272 where a cam (ramp) and cam follower (roller) positioned a certain locations causes the whole magnetron or a portion of the magnetron to move toward or away from the target assembly. The magnetron assembly uses a cam follower (roller)

442 and cam surface (ramp) 422 to produces a vertical roll motion with a dimension 432 as shown in FIG. 17. The end 440 of the magnetron assembly 272 includes a lift roller assembly frame 444 having a lift roller 442. The lift roller 442 and frame 444 travel with the magnetron assembly 272 at its ends (only one end 440, is shown), and when the lift roller 442 encounters the lift ramp 422 fixed to the chamber through a support fixture (e.g., support block 446), it rolls up the ramp 422 and as it is rolling up the ramp the end of the magnetron assembly is bent up a distance 432. In this configuration the translational force moving the magnetron assembly 272 from end to end also causes an end (e.g., 440) of the magnetron to be bent upwards when the ramps 422, 428 are encountered. The dashed lines, 424, 420, 430 in FIGS. 21, 22 and 23 represent the idealized bent, straight, and bent attitude (configurations), respectively, of the magnetron assembly 272 as it moves from end to end. In the idealized case, one side of the magnetron assembly 272 remains straight and parallel with the reference surface of the target assembly while the other side is bent up in a curve approximately as shown (the linear horizontal dashed lines are a reference against which the change in elevation at the end of the magnetron assembly can be evaluated), in practice there will be some impact on the free end of the assembly as there is some play between the linear bearings in the truck and the bearing rails and some vertical motion at the free end will occur.

In the top view of FIG. 24, probable locations for an upper left corner ramp 422 and a lower right corner ramp 428 are shown (the locations providing elastic bending of the magnetron assembly without excessive material stress—for example when an easily deformable material such as rubber is used). When the magnetron assembly 270 moves from its centrally located horizontal attitude (configuration) 420 taken at 22—22 in FIG. 24 to a first end of the chamber as shown by the attitude taken at 21—21, the resulting bending of the magnetron assembly is shown by the dashed line 424 and provides an offset dimension 426 from the center line (e.g., 420) at the end of the magnetron assembly. Similarly when the magnetron assembly 272 moves to the other end of the chamber as shown by the view taken at 23—23, the bent attitude of the magnetron assembly is shown by the dashed 430 provides a dimensional offset 432 from the center line (e.g., 420). In a symmetrical system the vertical offset dimensions 432, 426 due to the bend of the magnetron assembly at the two ends should be nearly identical, however it is possible to have a different vertical offset dimension at each end should empirical data show that such varying offsets are necessary. The control of sputtering to achieve non-uniform film thickness in a prescribed pattern can also be performed.

The illustrations of FIGS. 17A, 18A, and 20A show the use of four ramps (or cams) 415, 416, 417, 418, with a spring loaded center magnetron connection to the center bearing rails trucks (not shown here). The ends of he magnetron the top view of which is shown in FIG. 17A includes two sets of rollers 434, 436 which are located above a side of the magnetron 272a. When the magnetron nears the end of its lateral travel two of its rollers on one side (only one of which is shown, e.g., 434) contacts two ramps (i.e., 415, 418) and the magnetron undergoes an upward pitch to raise the edge of the magnetron nearest to the edge of the chamber by a distance 432a. This edge rise due a change in the pitch (again using an aircraft attitude reference) of the magnetron cause a reduction in the magnetic field at the edge of the target assembly and avoids excessive deposition due to edge effects which might otherwise be present. Thus the magnetron can undergo changes in its roll and pitch attitudes. A change in its yaw attitude would be possible if the bearing tracks were not generally linear or if the bearing trucks included a suspension allowing for some differential motion between adjacent bearing truck on a magnetron.

The conceptualized configurations of magnetron assemblies described above are carried out in practice by mechanisms as shown in FIGS. 25 and 26.

FIGS. 25 and 26 show the bottom and cross sectional views of a magnetron assembly 118 supported by a central bearing support frame 136 consisting of a linear bearing support section 142 and a lateral extension section 144. The linear bearing support section 142 has fixed to each of its sides bearing rails 138, 140 (a set of tracks). The magnetron assembly 118 is supported from the bearing rails 138, 140 through a set of linear rail trucks 120, 121. The linear rail trucks are fixed to the magnetron assembly 118 and slide back and forth on the linear rails 138, 140. The motion of the magnetron assembly in a back and forth (lateral) direction is accomplished by rotation of a threaded drive rod (ball screw) 112, which is received by a ball screw receiving nut 122 that includes a set of nut housing pin receiving holes 126, 128. A set of drive pins extend vertically from the magnetron assembly 118 into the holes 126, 128 to slide vertically to avoid binding in the mechanism due to misalignment between the linear rails 138, 140 and the rotatable threaded drive rod 112. The threaded drive rod is turned by a ball screw drive motor 114 supported outside the chamber top while the second end of the ball screw is supported by a ball screw end bearing 116. In this configuration, the movement of the central bearing support frame 136 in a vertical direction is accomplished by rotating a set of vertically oriented lead screws 148, 150, 152, to which toothed drive belt pulleys have been attached. A drive pulley and motor 156, are linked to the toothed drive belt pulleys by a toothed drive belt 154. When the belt drive pulley and motor 156 are turned, the pulleys 148, 150, 152 turn simultaneously to turn equally pitched lead screws engaged with stationary nuts to move the central bearing support frame 136 up and down while maintaining parallelism between the linear bearing support section 142 and the target.

In a conventional configuration, the horizontal attitude of the magnetron assembly 118 is controlled through the sliding attachment to the very precisely aligned bearing rails 138, 140.

In this way, the movement of the magnetron assembly is uniform and parallel with the usually flat front face of an unsputtered target prior to its being eroded or utilized. This configuration is used for sputtering of relatively small rectangular substrates up to approximately 400 mm×500 mm in size.

In the instance when the magnetron is to be tilted using a configuration according to the invention, the bearing rails 138, 140 are tilted (for example as shown by the configuration of FIG. 22), while the central bearing support frame 136 continues to be moved up and down while being held in a parallel attitude with the target assembly.

A method according to the invention includes vertically moving the magnetron assembly as shown in FIGS. 25 and 26, as the magnetron assembly moves laterally across the target assembly. However, given the variations in the depth target erosion profile as shown in FIG. 6, a parallel lifting of the magnetron assembly would not provide an improvement in the variation in film thickness uniformity or thickness control over the current vertically fixed arrangement. An alternate arrangement would be to drive each vertical support by separate motor/actuators, to control the vertical motion of the support beams and the magnetron assembly through electronic controls tied to the lateral position of the magnetron assembly.

Two Parallel Beam Bearing Supports

For large rectangular substrates approximately 600 mm×700 mm in size, a second mechanism shown conceptualized in FIGS. 27, and 28 and in detail in FIGS. 34 and 35 is utilized.

FIG. 27 shows the context of this second mechanism of the invention. A magnetron chamber 310 contains a magnetron assembly 312. The magnetron assembly 312 is supported by two bearing support beams 316, 317, which allow the magnetron assembly 312 fixed to a set of bearing trucks (e.g., 324) to move along a set of bearing rails (e.g., 322) in a lateral direction as shown by the arrows 314. The vertical movement of the bearing support beams 316, 318 is shown by the arrows 320. The lateral motion of the magnetron assembly 312 along the bearing rail 322 is produced by rotation of the threaded drive rod 326 which engages a threaded drive nut 328 contained within a threaded drive nut housing 330. The threaded drive nut housing 330 is fixed to a bowed section of a flexible spring-like connection 332, which is fixed to the magnetron assembly 312 such that misalignment or relative motion between the bearing support beams 316, 318 and threaded drive nut 326 provides a flexible connection in a vertical direction while providing rigidity in a transverse direction. The idealized tracking of the magnetron assembly 312 in the configuration of FIG. 27 is shown in FIG. 28. In FIG. 28 a magnetron assembly 342 is supported on two bearing support rails 344, 346 supported by end frames 348, 350. The end frames 348, 350 in this configuration being level and parallel with each other. The positioning of the left side rail 344 showing a vertical progression of the left end of the magnetron 342 from a lower edge of the frame 348 to an upper edge of the frame 350 at the opposite end. The positioning of the right side bearing support 346 shows vertical progression from an upper edge of the end frame 348 to a lower edge of the end frame 350 at the opposite end.

A magnetron assembly supported by end rails is shown in FIGS. 29 through 33. FIG. 29 shows the cross section of a processing chamber with the magnetron assembly 312 supported by two perimeter support rails 400, 402. This configuration is consistent with the conceptualized visualization of FIGS. 27 and 28. At one extreme end as can be seen in FIG. 30 (taken at the location of 30—30 in FIG. 33), the offset of the end of the rail 402 in a vertical direction an amount shown by the distance 408a results in a magnetron assembly attitude (tilt) as shown approximated by the dashed line 412. At a central location as can be seen in FIG. 31 (taken at the location of 31—31 in FIG. 33) a horizontal attitude 404 configures the magnetron to be parallel with the target surface or target reference surface (usually a plane). At the second end of the processing chamber as shown in FIG. 32, the cross section taken at 32—32 of FIG. 33, the position of the bearing rail 400 above the reference plane (e.g., parallel to 404 in FIG. 31), of the target assembly causes the attitude (tilt) of the magnetron assembly 312 to be approximately as shown by the dashed line 414. The vertical offset distance is represented by 408b. In this instance the horizontal offset from a lateral center line 406 of the processing chamber is a distance 410, therefore the vertical offset dimensions at the beam 408a 408b must be larger to achieve a similar change in attitude (tilt) when compared to the configuration of the magnetron assembly as is shown in FIGS. 11 through 16 where a smaller vertical offset at the bearing rail located closer to the opposite support rail results in a similar attitudinal change (tilt) per unit length from one end to the other end of the magnetron assembly 312.

The detailed views of FIGS. 34 and 35 show a magnetron assembly 178 as implemented in a magnetron chamber to be with a sputtering chamber. A magnetron assembly 178 (two alternate positions of which are shown in FIG. 34) is supported on a set of two bearing rails 206, 208, which are supported on a set of pseudo parallel edge bearing supports 198, 200. A set of linear rail trucks 180, 182, engage the bearing rails 206, 208, and move back and forth as driven by a threaded drive rod (ball screw) 172 (shown only by a dashed line in FIG. 34). In this mechanism, the back and forth motion of the magnetron assembly 178 is accomplished by the rotation of the drive rod 172 mounted between a ball screw drive motor 174 and a ball screw end bearing 176. The ball screw 172 engages a ball screw receiving nut 184 captured in a ball screw nut receiving housing 186. The ball screw receiving housing 186 is fixed to a flexible leaf spring-like connector 188 which is connected to the magnetron assembly 178 near its ends. The bearing rails 206, 208 as in the above mentioned mechanism are precisely aligned to be parallel with one another and with the face of a target being sputtered so that uniform deposition on a substrate can take place.

The magnetron assembly of FIGS. 34 and 35 is supported on bearing supports 198, 200 aligned to one another to act as a frame together with a set of end support frame members 202, 204. To provide vertical adjustment, four bearing mounted threaded support rods engaged with thread receiving nuts on the frame are fixed to toothed pulleys 210, 212, 214 and 216. A toothed drive belt 222 runs around the toothed pulleys 210, 212, 214, and 216 and around to idler pulleys 218, 220 to engage and be driven by a belt drive pulley and motor 224. When the belt drive pulley and motor 224 turn, each of the lead screws in the four corners are turned by the toothed pulleys fixed to the lead screws to cause parallel adjustment of the bearing support frame in a vertical direction. An alternate arrangement would be to drive each vertical support by separate motor/actuators, to control the vertical motion of the support beams and the magnetron assembly through electronic controls tied to the lateral position of the magnetron assembly.

Two-Piece Hinged Magnetron

Another configuration for a magnetron assembly 460 and its vertical manipulation is shown in FIGS. 36 and 37. These Figures show a cross section of a hinged magnetron assembly 460 utilizing a center support rail 462 which can be continuously bent as shown in FIG. 37 or can be a series of linear segments. In these configurations a center intersection of the two hinged sections of the magnetron assembly 460 are supported from the center bearing rail 462 to provide variations in the distance from the sputtering target to the center of the magnetron assembly 460 as the magnetron assembly cycles from end to end. The variation in horizontal distances due to the different horizontal dimensions when comparing a hinged magnetron and a straight magnetron is accommodated by curving the perimeter bearing beams inward or by providing a fixed connection between the a bearing truck attached to the center support rail 462 while the bearing truck connections to the side support rails 464, 466, are free to move (slide) toward and away from the center bearing rail 462, details of such connections can be developed and executed by persons of ordinary skill in the art.

Segmented Magnetron Following Reference Contour

Another embodiment according to the invention is pictured in FIG. 38. In this embodiment one or more cam surfaces and cam followers are utilized to change the distance between portions of a magnetron assembly having magnetron sub-sections which can move independently while maintaining a semblance of a continuous loop of adjacent permanent magnets in the magnet array in the magnetron. The magnet sub-sections (a series of magnet member subsections) can be pivotable and can be hinged together like a chain, to provide a continuous magnetic field, or can be encased in a flexible housing. As shown in FIG. 38, several cam surfaces (a series of cam surfaces) can be combined to form a continuous cam surface plate 476 reflecting the profile/pattern to be followed by each subsection of the magnetron and the magnetron assembly as a whole. The cam surface plate 476 includes several adjacent cam surface slots (e.g., 478) through which a cam follower rod (e.g., 474) connects a cam follower (e.g., 482) with a sub-section (e.g., 472) of the magnetron assembly. A magnetron contour tracking frame 486 maintains the vertical alignment between the cam followers (e.g., 482) and magnetron sub-sections (e.g., 472) so that they track together (as driven by a lateral drive) to provide an improvement in the control of film thickness and/or its uniformity. Each track of the profile-surface pattern varies the distance between each particular sub-section (e.g., 472) of the magnetron assembly and the target below.

Another configuration according to the invention is shown in FIG. 38A. In FIG. 38A a magnetron 488 is constructed of a flexible material such that each vertical control member (of a series of vertical drives) controls the vertical elevation of a portion of the magnetron 488. The tracking frame 486 is cut away for clarity. In this configuration, the influence of the magnetron 488 on the target can be precisely controlled, by increasing the number of vertical control members (push/pull rods) and/or by providing such vertical control members on each side of the magnetron so that a desired pitch attitude can be achieved.

FIGS. 39–42 show conceptualized idealized approximations of three of a variety of surface patterns/profiles that might be utilized for the cam surface 476.

In FIG. 39 a surface pattern/profile has a shape similar to the surface pattern/profile tracked by the magnetron assembly of the configuration as shown in FIGS. 9–15 (opposite corners being high, while adjacent opposite corners are low). In this profile a back corner 494 and a front corner 498 are low, while a right side corner 492 and a left side corner 496 are raised. Therefore, the elevation change between the rails which ostensibly connect the bottom corner 498 with the right corner 492 is from low to high, while the rail which connects from back corner 494 to left corner 496 is from high to low.

FIG. 40 shows a surface following a two dimensional circular or parabolic shaped curve. A high point of the curve and the arc shaped surface is along the center lateral axis 503. In practice, a bearing rail elevation would follow a edge of the pictured surface, for example from the right corner 504 to the bottom corner 510 and from the top corner 506 to the left hand corner 508.

The surface profile/pattern contour of FIG. 41 shows an upwardly parabolic or rounded type shape where all of the corners, right corner 516, back corner 518, left corner 520, and front corner 522 are approximately at equal high elevations, while a center 515 of the corners is at a low point. A magnetron assembly following this surface pattern will have magnet sub-sections in the magnet array of the a magnetron assembly which cause the center portion of the magnet array to approach the back of the target to increase the sputtering at that location. Alternately, the configuration may be used so that the magnetic field effect uniformly sputters a circularly or parabolically shaped target to sputter deposit a similarly shaped circularly or parabolically shaped substrate (e.g., a parabolic mirror) without having to form a specially shaped magnetron. In using this configuration the deposition film thickness can be kept relatively constant utilizing a magnetron sub-section surface pattern/profile as shown by FIG. 41.

FIG. 42 shows a concave down circular or parabolic surface shape with four corners 528, 530, 532 and 534 being the low point of the surface profile/pattern, while a high point of the surface profile/pattern is at a center 527.

A person of ordinary skill in the art will understand that the mechanical cam shape (e.g., of FIG. 38) or any generally reasonably continuous cam surface profile/pattern can be utilized to change the distance between the magnetron sub-sections and the target assembly. The surface patterns/profiles shown are but several of the many varieties of surface patterns that might be utilized. Variations in the cam surface/profile can accommodate desired localized changes in the sputtering rate at those particular locations by forming the cam surface accordingly.

Vertical Actuators

Another configuration of the device according to the invention is to utilize a planar follower plate 546 which utilizes an approximately flat plate and a structure which correlates a lateral position and a vertical position of each sub-section (e.g., 542) of the magnetron as shown in FIG. 43. Each sub-section (e.g., 542) is connected through a vertical positioning rod (e.g., 544) to a contour plate follower activator (e.g., 552). These collectively makeup an activator assembly (e.g., 550). The activator assembly (e.g., 550) moves in a slot (e.g., 548) in the planar follower plate 546 according to the motion of a magnetron contour tracking frame 558 (shown in dashed lines) which ties all of the activator assemblies together so that they move simultaneously in a lateral direction as the magnetron assembly (including all of the magnetron sub-sections) sweeps laterally across the target assembly. The vertical position of each magnetron sub-section 542 is set according to a control system 554 which receives elevation control data which establishes an elevation for each magnetron sub-section location as the magnetron cycles from end to end. The elevation control data causes the magnet sub-sections to moves in a programmed manner according to a programmed surface profile/pattern. The programmed pattern causes the magnet sub-section to move as if it were following a surface pattern of a mechanical cam surface (i.e., as shown in FIG. 38) utilizing electronic programming to cause the activators to move the magnetron sub-sections according to programming of a contour generator 556, which provides a reference contour to the control system 554. The programming of the contour data is easily changed to adjust the magnetron tracking according to a desired surface pattern/profile.

Electro-Magnet Magnetron Control of Sputtering

FIGS. 44 and 45 show a magnetron configuration using electro-magnets which can be used to control sputtering. A magnetron 560 held in a plane generally parallel to a target's surface is swept back and forth across the back of a target assembly. As the magnetron 560 is moved electromagnets in the magnetron are energized and the intensity of the magnetic field generated by each electromagnet in the array is varied according to a contour plot 556a which sets out the desired film deposition profile based on empirically derived knowledge of variations in the physical configuration. Thus as the magnetron moves back and forth the magnetic field is electrically varied to achieve a result similar to that achieved by moving a magnetron with permanent magnets closer to and further away from the back of the target assembly. The magnet array in such a configuration may include a combination of permanent and electromagnets, and such electro magnets may be used in conjunction with a vertical motion or with motion in a plane. In the extreme, a static array of electromagnets could have an area covering the substrate surface and the movement of magnetic field would be electronically controlled by controlling the energization and deenergization of selected electromagnets.

FIG. 45 shows a configuration of the magnetron 560 utilizing electromagnets. The magnets are aligned in the same way as shown in FIG. 4 except that each permanent magnet segment is replaced by a electromagnetic core (preferably iron) possibly in the shape of a spool 564 as shown, with each spool 564 being surrounded by a wire coil 568. The strength of the magnetic field is individually controlled by a circuit wires 576 connected to the contour controller 554a. As the magnetron travels back and forth the magnetic field strength is varied by changing the electrical power supplied to the electromagnetic coils and sputtering is enhanced accordingly.

A method according to the invention for selectively controlling the film thickness deposited on a substrate during sputtering includes the steps of moving a magnet member laterally in the proximity of a sputtering target and varying the strength of the magnetic field enhancing sputtering at the target surface as the magnet member moves laterally to deposit a particular film thickness pattern on the substrate during processing during sputtering. It may be desirable to have a different than uniform film thickness, for example it may be desirable to increase the film thickness at the edge of the substrate so that wiring connections between the conductive layers deposited on the substrate have an increased durability and are less subject to fracture. In general it is expected that the tolerances for film thickness uniformity over a substantial portion of the substrate will have to be maintained, whether localized anomalies in film thickness are desired or not. The structure and method according to the invention provides uniformity where uniformity in film thickness is desired and provides non-uniformity where non-uniformity is desired A method according to the invention utilizes moving magnet sections or magnetron assemblies laterally while utilizing a vertical support which changes the elevation of particular portions of the magnetron assembly according to its lateral position to improve film thickness uniformity.

A method according to the invention includes the steps of moving a magnet member laterally in the proximity of a sputtering target and moving portions of said magnet vertically, a distance greater than a tolerance for parallelism between a reference plane and the plane of motion at selected locations to vary the magnetic field strength causing a divergence from the plane to improve the film thickness uniformity. Another method according to the invention includes the steps of moving a magnet member laterally along a track and moving portions of the magnet member in a vertical direction simultaneously with the lateral motion of the magnet member to change the magnetic field intensity utilized for sputtering at one or more locations along the track to improve film thickness uniformity or thickness control for sputtering. The magnet member can be moved laterally along a track and while portions of the magnet member are moved in a vertical direction simultaneously with the lateral motion of the magnet member to change the magnetic field intensity utilized for sputtering at one or more locations along the track to improve the control of the film thickness deposited during sputtering.

In a method according to the invention the step of varying the strength of the magnetic field includes changing the strength of electromagnets in the magnetic member according to a pattern depending on the lateral location of the magnet member.

While the invention has been described with regards to specific embodiments, those skilled in the art will recognize that changes can be made in form and detail without departing from the spirit and scope of the invention.

We claim:

1. A magnetron sputtering apparatus, comprising:
   a magnet member having a magnetic field emanating therefrom disposed in the proximity of a sputtering target,
   a magnet member cycling system which during sputtering of said sputtering target causes said magnet member to move in a set pattern,
   wherein said set pattern of motion is defined by a set of points defining a pattern reference surface, wherein the pattern reference surface is defined by a set of lateral coordinates and a set of vertical coordinates of the pattern,
   wherein said set of lateral coordinates establish a defined set of locations on an offset reference surface which is approximately parallel to a reference surface of said sputtering target and offset from it,
   wherein said set of vertical coordinates establish a defined set of elevations for said set pattern at each respective lateral coordinate of said set of lateral coordinates,
   wherein said pattern reference surface includes a divergent portion having a subset of said defined set of elevations establishing the elevation of the pattern reference surface within said divergent portion at a distance from said offset reference surface at each respective lateral coordinate of said set of lateral coordinates, wherein the elevation of the pattern reference surface within said divergent portion falls outside a range of tolerance for parallelism between said offset reference surface and said reference surface of said sputtering target.

2. The magnetron sputtering apparatus as in claim 1, wherein motion of said magnet member following said divergent portion of said pattern reference surface, rather than following a non-divergent portion of said pattern in which said distance would fall within the range of tolerance for parallelism between offset reference surface and said reference surface of said sputtering target, provides an improvement in the uniformity or thickness control of film thickness deposited on the surface of a substrate, located opposite said sputtering target, being sputter deposited.

3. The magnetron sputtering apparatus as in claim 1,
   wherein said reference surface of said sputtering target is defined by unused pre-sputtering configuration surface of said sputtering target facing a processing chamber.

4. The magnetron sputtering apparatus as in claim 2,
   wherein said reference surface of said sputtering target is defined by an unused pre-sputtering configuration of a front surface of said sputtering target facing a processing chamber.

5. The magnetron sputtering apparatus as in claim 1, 2, 3, or 4, wherein said tolerance for parallelism is 0.0075 inches per foot of motion along said offset reference surface.

6. The magnetron sputtering apparatus as in claim 1, 2, or 3,
wherein said tolerance for parallelism is 0.010 inches per foot of motion along said offset reference surface.

7. The magnetron sputtering apparatus as in claim 1, 2, or 3, wherein said tolerance for parallelism is 0.015 inches per foot of motion along said offset reference surface.

8. The magnetron sputtering apparatus as in claim 1, 2, or 3, wherein said tolerance for parallelism is 0.020 inches per foot of motion along said offset reference surface.

9. The magnetron sputtering apparatus as in claim 1, 2, or 3,
wherein said tolerance for parallelism is 0.025 inches per foot of motion along said offset reference surface.

10. The magnetron sputtering apparatus as in claim 1, 2, or 3, wherein said tolerance for parallelism is 0.030 inches per foot of motion along said offset reference surface.

11. The magnetron sputtering apparatus as in claim 1, 2, or 3, wherein said tolerance for parallelism is 0.035 inches per foot of motion along said offset reference surface.

12. The magnetron sputtering apparatus as in claim 1, 2, or 3, wherein said tolerance for parallelism is 0.040 inches per foot of motion along said offset reference surface.

13. The magnetron sputtering apparatus as in claim 1, 2, or 3, wherein said tolerance for parallelism is 0.050 inches per foot of motion along said offset reference surface.

14. The magnetron sputtering apparatus as in claim 1, wherein said set pattern of said cycling system results from a motion along a set of tracks supporting and guiding the magnet member,
    wherein the configuration of said set of tracks establishes said set of lateral coordinates and said set of vertical coordinates of said set pattern, including said divergent portion.

15. The magnetron sputtering apparatus as in claim 14, wherein said motion along said set of tracks is a back and forth motion.

16. The magnetron sputtering apparatus as in claim 1, further comprising:
    a set of tracks supporting and guiding the magnet member
    a cam surface fixed to a first of either said magnet member or a fixed support adjacent said tracks and a cam follower fixed to a second of either said magnet member or said fixed support,
    wherein a divergent portion of said motion, corresponding to said divergent portion of said pattern reference surface, results from a motion along said set of tracks,
    wherein said set pattern of said cycling system results at least partially from a motion along said set of tracks where during said set motion said cam follower comes into contact with said cam surface and urges said magnet member in a vertical direction to follow a motion corresponding to the divergent portion of said pattern reference surface.

17. The magnetron sputtering apparatus as in claim 1,
    wherein said magnet member includes a series of magnet member subsections,
    wherein said magnetron apparatus further comprises:
        a set of tracks, wherein each one of said set of tracks supports and guides a corresponding subset of said series of magnet member subsections,
        a series of cam surfaces, each one of said series of cam surfaces being fixed to a first of either a subsection of said series of magnet member subsections or a fixed support adjacent said tracks and a cam follower fixed to a second of either a subsection of said series of magnet member subsections or said fixed support,
    wherein a divergent portion of said motion, corresponds to said divergent portion of said pattern reference surface,
    wherein said set pattern of said cycling system results at least partially from a motion along said set of tracks where during said set motion said cam follower comes into contact with said cam surface and causes at least one of said series of magnet member sections to move in a vertical direction to follow a motion corresponding to the divergent portion of said pattern reference surface.

18. The magnetron sputtering apparatus as in claim 17,
wherein said series of cam surfaces form a continuous cam plate surface.

19. The magnetron sputtering apparatus as in claim 1,
wherein said magnet member includes a series of magnet member subsections,
wherein said magnetron apparatus further comprises:
    a set of tracks, wherein each one of said set of tracks supports and guides a corresponding subset of said series of magnet member subsections as a lateral drive moves each one of said series of magnet member subsections in a lateral direction,
    a series of vertical drives, each one of said series of vertical drives being fixed to provide relative motion between each respective subsection of said series of magnet member subsections and said lateral drive,
wherein a divergent portion of said motion, corresponds to said divergent portion of said pattern reference surface,
wherein said recurring pattern of said cycling system results at least partially from a vertical motion provided by said vertical drive as a result of programming a control of said vertical drive to provide a preset pattern of relative motion corresponding to the divergent portion of said pattern reference surface.

20. A magnetron sputtering apparatus comprising:
    a sputtering target assembly having a first side opposite a second side wherein a target surface on said first side is exposed to a sputtering chamber;
    a traveling magnet member disposed to travel along a track on a second side of said target assembly, said magnet member including components which produce a magnetic field extending beyond the surface of said magnet member toward said target surface,
    wherein a portion of said magnet member travels in a plane approximately parallel to an unused pre-sputtering configuration of said surface of said first side of said target, except in a divergent portion, where the distance of a portion of the magnetic member and said unused configuration of said surface of said first side of said target assembly exceed a range of tolerance for parallelism between said plane and said unused pre-sputtering configuration of said surface of said first side of said target.

21. The magnetron sputtering apparatus as in claim 20,
wherein travel of said magnet member following said divergent portion, rather than following said plane, provides an improvement in the uniformity of film thickness deposited on the surface of a substrate, located opposite said sputtering target, being sputter deposited.

22. The magnetron sputtering apparatus as in claim 20 or 21,
wherein said tolerance for parallelism is 0.0075 inches per foot of motion along said track.

23. The magnetron sputtering apparatus as in claim 20 or 21,
    wherein said tolerance for parallelism is 0.010 inches per foot of motion along said track.

24. The magnetron sputtering apparatus as in claim 20 or 21,
    wherein said tolerance for parallelism is 0.015 inches per foot of motion along said track.

25. The magnetron sputtering apparatus as in claim 20 or 21,
    wherein said tolerance for parallelism is 0.020 inches per foot of motion along said track.

26. The magnetron sputtering apparatus as in claim 20 or 21,
    wherein said tolerance for parallelism is 0.025 inches per foot of motion along said track.

27. The magnetron sputtering apparatus as in claim 20 or 21,
    wherein said tolerance for parallelism is 0.030 inches per foot of motion along said track.

28. The magnetron sputtering apparatus as in claim 20 or 21,
    wherein said tolerance for parallelism is 0.035 inches per foot of motion along said track.

29. The magnetron sputtering apparatus as in claim 20 or 21,
    wherein said tolerance for parallelism is 0.040 inches per foot of motion along said track.

30. The magnetron sputtering apparatus as in claim 20 or 21,
    wherein said tolerance for parallelism is 0.050 inches per foot of motion along said track.

31. The magnetron sputtering apparatus as in claim 20,
    wherein said magnet member includes a series of magnet member subsections,
    wherein movement along said track results from a programming of a motor to raise and lower each subsection of said set of subsections according a programmed pattern depending on the lateral position of said magnet member as it moves laterally.

32. The magnetron sputtering apparatus as in claim 20,
    wherein the magnet member includes at least two sections, wherein a set of tracks comprising said track in a center track supporting an end of each section of said at least two sections, said magnet member being hinged at said center track.

33. A magnetron scanning apparatus comprising:
    a magnet member running as a truck on a set of separated linear bearing rails which are approximately parallel, where during sputtering to improve the uniformity of film thickness sputter deposited on a substrate opposite a target disposed between said target assembly and said magnet member a first end of a first rail of said set of bearing rails is raised to be further from the target than a second end of said first rail of said set of bearing rails.

34. A magnetron scanning apparatus as in claim 33,
    where during sputtering to further improve the uniformity of film thickness sputter deposited, a second end of a second rail of said set of bearing rails is raised to be further from the target than a first end of said second rail of said set of bearing rails, wherein said second end of said second rail of said set of bearing rails corresponds to said second end of said first rail of said set of bearing rails.

35. A magnetron sputtering apparatus as in claim 34,
    wherein a set of vertical positions of said first and said second ends of said rails is set by a vertical travel mechanism which can raise and lower said first and said second ends of said first and second rails to set the tracking of the magnet member.

36. A magnetron sputtering apparatus as in claim 35,
    wherein said vertical travel mechanism operates during sputtering and tracking of said magnet member.

37. A method for selectively controlling the film thickness deposited on a substrate during sputtering comprising the steps of:
    moving a magnet member laterally in an approximately linear pattern in the proximity of a sputtering target and
    varying the strength of the magnetic field enhancing sputtering at the target surface as the magnet member moves laterally to deposit a particular film thickness pattern on the substrate during processing during sputtering.

38. The method for selectively controlling the film thickness deposited on a substrate during sputtering as in claim 37,
    wherein the step of varying the strength of the magnetic field includes moving portions of said magnet member vertically.

39. The method for selectively controlling the film thickness deposited on a substrate as in claim 38,
    wherein the step of moving portions of the magnet member vertically provides that the vertical distance is a distance greater than a tolerance for parallelism between a reference plane and the plane of motion at selected locations to vary the magnetic field strength causing a divergence from the plane to control the film thickness uniformity.

40. The method for selectively controlling the film thickness deposited on a substrate during sputtering as in claim 37,
    wherein the step of varying the strength of the magnetic field includes changing the strength of electromagnets in said magnetic member according to a pattern depending on the lateral location of the magnet member.

41. A method for selectively controlling the film thickness deposited on a substrate during sputtering comprising the steps of:
    moving a magnet member laterally along an approximately linear track and
    moving portions of the magnet member in a vertical direction simultaneously with the lateral motion of the magnet member to change the magnetic field intensity utilized for sputtering at one or more locations along the track to improve the control of the film thickness deposited during sputtering.

42. A method for selectively controlling the film thickness deposited on a substrate during sputtering comprising the steps of:
    locating a magnetic field opposite a sputtering target;
    moving the magnetic field laterally across the target;
    varying the strength of the magnetic field at locations where a localized change in the deposited film thickness is desired
    wherein the step of varying the strength of the magnetic field includes changing the strength of electro-magnets in said magnetic member according to a pattern depending on the lateral location of the magnet member.

* * * * *